US012292685B2

(12) United States Patent
Komori

(10) Patent No.: US 12,292,685 B2
(45) Date of Patent: May 6, 2025

(54) SUBSTRATE PROCESSING APPARATUS

(71) Applicant: SCREEN HOLDINGS CO., LTD., Kyoto (JP)

(72) Inventor: Jun Komori, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 191 days.

(21) Appl. No.: 18/182,875

(22) Filed: Mar. 13, 2023

(65) Prior Publication Data
US 2023/0296985 A1   Sep. 21, 2023

(30) Foreign Application Priority Data
Mar. 18, 2022 (JP) .................................. 2022-044467

(51) Int. Cl.
*G03F 7/16* (2006.01)
(52) U.S. Cl.
CPC .................................... *G03F 7/162* (2013.01)
(58) Field of Classification Search
CPC .......... G03F 7/162; G03F 7/30; G03F 7/3021; G03F 7/32; H01L 21/67051
See application file for complete search history.

(56) References Cited

U.S. PATENT DOCUMENTS

| | | | |
|---|---|---|---|
| 4,564,280 A | 1/1986 | Fukuda | 354/317 |
| 6,770,151 B1 | 8/2004 | Ravkin et al. | 134/33 |
| 8,950,414 B2* | 2/2015 | Ito | H01L 21/67051 134/902 |
| 11,322,346 B2* | 5/2022 | Park | B05B 13/0228 |
| 11,764,081 B2* | 9/2023 | Huang | H01L 21/6719 134/2 |
| 2003/0010361 A1 | 1/2003 | Boyd et al. | 134/26 |
| 2005/0121059 A1 | 6/2005 | Boyd et al. | 134/102.3 |
| 2008/0289715 A1 | 11/2008 | Nakashima et al. | 138/106 |

(Continued)

FOREIGN PATENT DOCUMENTS

| | | |
|---|---|---|
| JP | 2002-246292 A | 8/2002 |
| JP | 2007-311446 A | 11/2007 |
| JP | 2021-086994 A | 6/2021 |

(Continued)

OTHER PUBLICATIONS

Office Action dated Apr. 30, 2024 issued in corresponding Korean Patent Application No. 10-2023-0033634.

(Continued)

*Primary Examiner* — Hung V Nguyen
(74) *Attorney, Agent, or Firm* — OSTROLENK FABER LLP

(57) ABSTRACT

A development device has a plurality of nozzles and a plurality of pipes. The plurality of nozzles supply a processing liquid to a substrate. Each of the plurality of pipes is connected to one of the plurality of nozzles and supplies a processing liquid to a nozzle to which the pipe is connected. The development device includes a support and a cover member. The support supports portions of the plurality of pipes. The cover member contains part of the plurality of nozzles and the plurality of pipes while allowing supply of the processing liquid to substrates from the plurality of nozzles. When the support moves or rotates, the plurality of nozzles move between a processing position and a waiting position.

7 Claims, 16 Drawing Sheets

(56) References Cited

U.S. PATENT DOCUMENTS

2011/0023909 A1    2/2011  Ito .................................. 134/18
2020/0111715 A1*  4/2020  Naohara .............. H04N 23/695

FOREIGN PATENT DOCUMENTS

| KR | 10-2008-0034759 A | 4/2008 |
| KR | 10-2010-0041497 A | 4/2010 |
| KR | 10-2014-0071651 A | 6/2014 |

OTHER PUBLICATIONS

Extended European Search Report dated Jul. 10, 2023, issued in counterpart European Patent Application No. 23162089.9.

* cited by examiner

FIG. 8
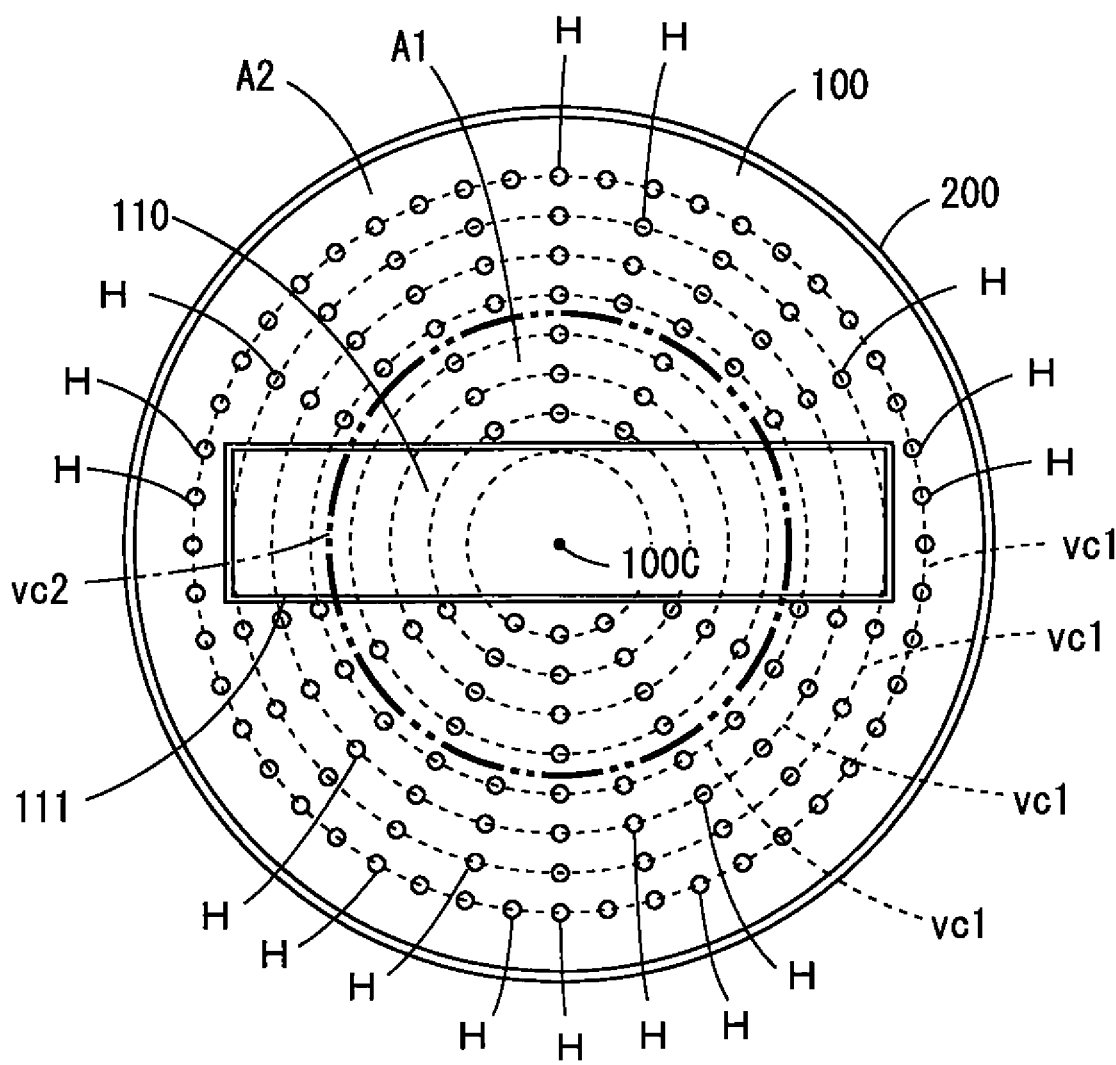
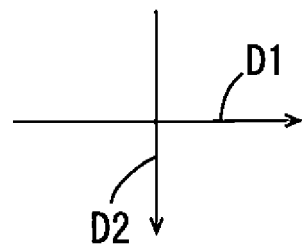

SUBSTRATE PROCESSING APPARATUS

BACKGROUND

Technical Field

The present invention relates to a substrate processing apparatus that performs processing on a substrate using a processing liquid.

Description of Related Art

Conventionally, a substrate processing apparatus is used to perform predetermined processing using a processing liquid on various substrates such as a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate or a substrate for a solar cell.

As such a substrate processing apparatus, there is a development device that performs development processing on a photosensitive film using a development liquid. For example, the development device includes a spin chuck that rotates a substrate while holding the substrate in a horizontal posture, a nozzle that supplies a developing liquid onto the substrate and a cup provided so as to surround the substrate held by the spin chuck. During the development processing, a development liquid is supplied from the nozzle onto the substrate rotated by the spin chuck. The development liquid supplied onto the substrate during the development processing splashes around the substrate. A large portion of the development liquid splashing around the substrate is received to be collected by the cup.

The upper end of the cup is open. Therefore, part of the development liquid splashing from the substrate during the development processing may splash from the upper end opening of the cup to the outside of the cup and adheres to the cup and its peripheral members. The development liquid adhering to the cup and its peripheral members causes generation of particles in the development device.

In order to suppress generation of particles in the development device, the development device described in JP 2002-246292 A includes a lid that closes the upper end opening of the cup. A slit into which a plurality of development liquid supply nozzles can be inserted is formed in the lid. In the development device, the upper end opening of the cup is closed by the lid with the substrate held by the spin chuck. Further, a plurality of development liquid supply nozzles are inserted into the slit of the lid, and the development liquid is supplied to the substrate rotated by the spin chuck. Thus, because the development liquid is supplied from the plurality of development liquid supply nozzles to the substrate in the space closed by the lid and the cup, splashing of the development liquid above the cup during the development processing is suppressed.

SUMMARY

The development device described in JP 2002-246292 A includes a plurality of cleaning liquid supply nozzles in addition to the plurality of above-mentioned development liquid supply nozzles. The plurality of development liquid supply nozzles and the plurality of cleaning liquid supply nozzles are held so as to be alternately arranged on an arm extending in one direction. When the arm is moved up and down by the moving mechanism, the plurality of developing liquid supply nozzles and the plurality of cleaning liquid supply nozzles are inserted into the lid from the outside of the lid through the slit. Further, the plurality of development liquid supply nozzles and the plurality of cleaning liquid supply nozzles are drawn out from the inside of the lid to the outside of the lid through the slit.

A plurality of pipes are respectively connected to the plurality of development liquid supply nozzles and the plurality of cleaning liquid supply nozzles. These pipes are respectively flexible so as to deform as the arm moves. Therefore, when the plurality of pipes are respectively deformed in an unintended direction during fabrication or maintenance of the development device, handleability of the plurality of pipes is degraded.

Further, in a case in which the degree of freedom in regard to deformation of the plurality of pipes is high, the plurality of pipes may come into contact with one an other or the plurality of pipes rub against one another during movement of the arm. Such contact and rubbing of the plurality of pipes causes generation of particles and shortening of lifetime of the plurality of pipes. In this case, cleanliness in the processing space of the development device is reduced, and the replacement frequency of the plurality of pipes in the development device increases.

An object of the present invention is to provide a substrate processing apparatus that can improve handleability of a plurality of pipes connected to a nozzle and reducing generation of particles and shortening of lifetime of the plurality of pipes caused by movement of each of the plurality of pipes with a high degree of freedom.

(1) A substrate processing apparatus according to one aspect of the present invention includes a substrate holder that holds a substrate, a plurality of nozzles that respectively supply a processing liquid to a substrate held by the substrate holder, a plurality of liquid pipes that are flexible, have first portions respectively connected to the plurality of nozzles and supply a processing liquid to the plurality of nozzles, a support that supports the plurality of nozzles and supports the first portions of the plurality of liquid pipes, a containing member that is attached to the support and contains the plurality of nozzles and the first portions of the plurality of liquid pipes while allowing supply of a processing liquid to the substrate from the plurality of nozzles, and a nozzles driver that moves each of the plurality of nozzles between a processing position above the substrate held by the substrate holder and a waiting position outwardly of the substrate held by the substrate holder.

In the substrate processing apparatus, because being contained in the containing member, the plurality of nozzles and the first portions of the plurality of liquid pipes can be handled integrally with the containing member. Therefore, handleability of the plurality of nozzles and the plurality of liquid pipes in the substrate processing apparatus is improved.

Further, in a case in which the plurality of nozzles move between the processing position and the waiting position, the support moves or rotates. At this time, the plurality of nozzles and the first portions of the plurality of liquid pipes connected to the nozzles are contained in the containing member. Thus, because the range in which the first portions of the plurality of liquid pipes are deformable is limited to the inside of the containing member, large deformation of each of the first portions of the plurality of liquid pipes during movement of the plurality of nozzles is suppressed. This reduces generation of particles and shortening of lifetime of the plurality of liquid pipes caused by movement of the plurality of respective pipes with a high degree of freedom.

(2) The support may be formed to extend linearly, the plurality of nozzles may be attached to the support to be aligned in a direction in which the support extends, and the containing member may be formed to extend along the support.

In this case, the first portions of the plurality of liquid pipes can be contained in the containing member to extend in parallel with the support. This suppresses formation of large play in the plurality of liquid pipes in the containing member. Further, the containing member can be made compact.

(3) The support may include a plurality of nozzle fixing portions to which the plurality of nozzles are respectively fixed, and a first pipe fixing portion to which the first portions of the plurality of liquid pipes are fixed while being bound.

In this case, the first portions of the plurality of liquid pipes are fixed to the support by the plurality of nozzles fixed by the plurality of nozzle fixing portions and the first pipe fixing portion of the support. Therefore, when the support moves or rotates, large deformation of each of the first portions of the plurality of liquid pipes is suppressed.

(4) The plurality of liquid pipes may respectively further have second portions respectively extending from the first portions, and the substrate processing apparatus may further include a cylinder binder that is formed to bind the second portions of the plurality of liquid pipes and cover the second portions of the plurality of bound liquid pipes, and a second pipe fixing portion to which the second portions of the plurality of liquid pipes bound by the cylindrical binder are fixed.

In this case, handleability of the second portions of the plurality of liquid pipes which are not fixed to the support is improved. Further, because the cylindrical binding member is flexible, a degree of freedom in regard to movement or rotation of the support is not limited.

(5) The substrate processing apparatus may further include a chamber that has an inner space and contains the substrate holder, the plurality of nozzles, the plurality of liquid pipes, the support, the containing member and the nozzle driver in the inner space, and a partition that partitions the inner space of the chamber into a processing space including the substrate held by the substrate holder and a non-processing space surrounding at least part of the processing space with the substrate held by the substrate holder, wherein the partition may include a processing cup that is provided to surround a substrate held by the substrate in a plan view and overlap with the substrate held by the substrate holder in a side view, and forms the processing space, a partition plate that is provided at a position above the processing cup and has a nozzle opening formed to overlap with the processing position in a plan view, and the containing member may be configured to cover the nozzle opening while allowing supply of a processing liquid from the nozzle to the substrate with the substrate held by the substrate holder and the plurality of nozzles located at the processing position.

In this case, when the plurality of nozzles are at the processing position and the processing liquid is supplied to the substrate, the nozzle opening of the partition plate is covered by the containing member. This reduces leakage of an atmosphere in the processing space from the nozzle opening of the partition plate to the non-processing space.

(6) The plurality of nozzles may include one or a plurality of two-fluid nozzles that inject a fluid mixture including gas and droplets of the processing liquid to the substrate held by the substrate holder. In this case, it is possible to process the substrate using a fluid mixture including gas and liquid.

(7) The substrate processing apparatus may further include one or a plurality of gas pipes that supply gas to the one or plurality of two-fluid nozzles, wherein the one or plurality of gas pipes may have third portions respectively connected to the one or plurality of two-fluid nozzles, and the third portions of the one or plurality of gas pipes may be supported by the support and contained in the containing member. In this case, gas is supplied to the two-fluid nozzle.

(8) A processing liquid supplied from at least part of the plurality of nozzles to the substrate may include an organic solvent. In this case, it is possible to process the substrate using a processing liquid using an organic solvent.

Other features, elements, characteristics, and advantages of the present disclosure will become more apparent from the following description of preferred embodiments of the present disclosure with reference to the attached drawings.

BRIEF DESCRIPTION OF THE DRAWING

FIG. 8 is a plan view of the partition plate and the cylindrical member of FIG. 2;

DETAILED DESCRIPTION

A substrate processing apparatus according to embodiments of the present invention will be described below with reference to the drawings. In the following description, a substrate refers to a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate, a substrate for a solar cell or the like.

A development device will be described as one example of the substrate processing apparatus. A substrate subjected to development processing in the present embodiment has a main surface and a back surface. Further, in the development device according to the present embodiment, with the main surface of the substrate directed upwardly and the back surface of the substrate directed downwardly, the back surface (lower surface) of the substrate is held, and development processing is performed on the main surface (upper surface) of the substrate.

A photosensitive film on which exposure processing has been performed is formed at least in the center portion of the main surface of the substrate. This photosensitive film is a negative photosensitive polyimide film, for example. As a development liquid for dissolving the exposed negative photosensitive polyimide film, an organic solvent including cyclohexanone, cyclopentanone or the like is used. As a rinse liquid, an organic solvent including isopropyl alcohol, propylene glycol monomethyl ether acetate (PGMEA) or the like is also used.

In the present embodiment, "development processing for a substrate" means dissolution of part of a photosensitive film by supply of a development liquid to the photosensitive film which is formed on a main surface of a substrate after exposure processing is performed on the photosensitive film.

<1> Configuration of Development Device

Figure 1:
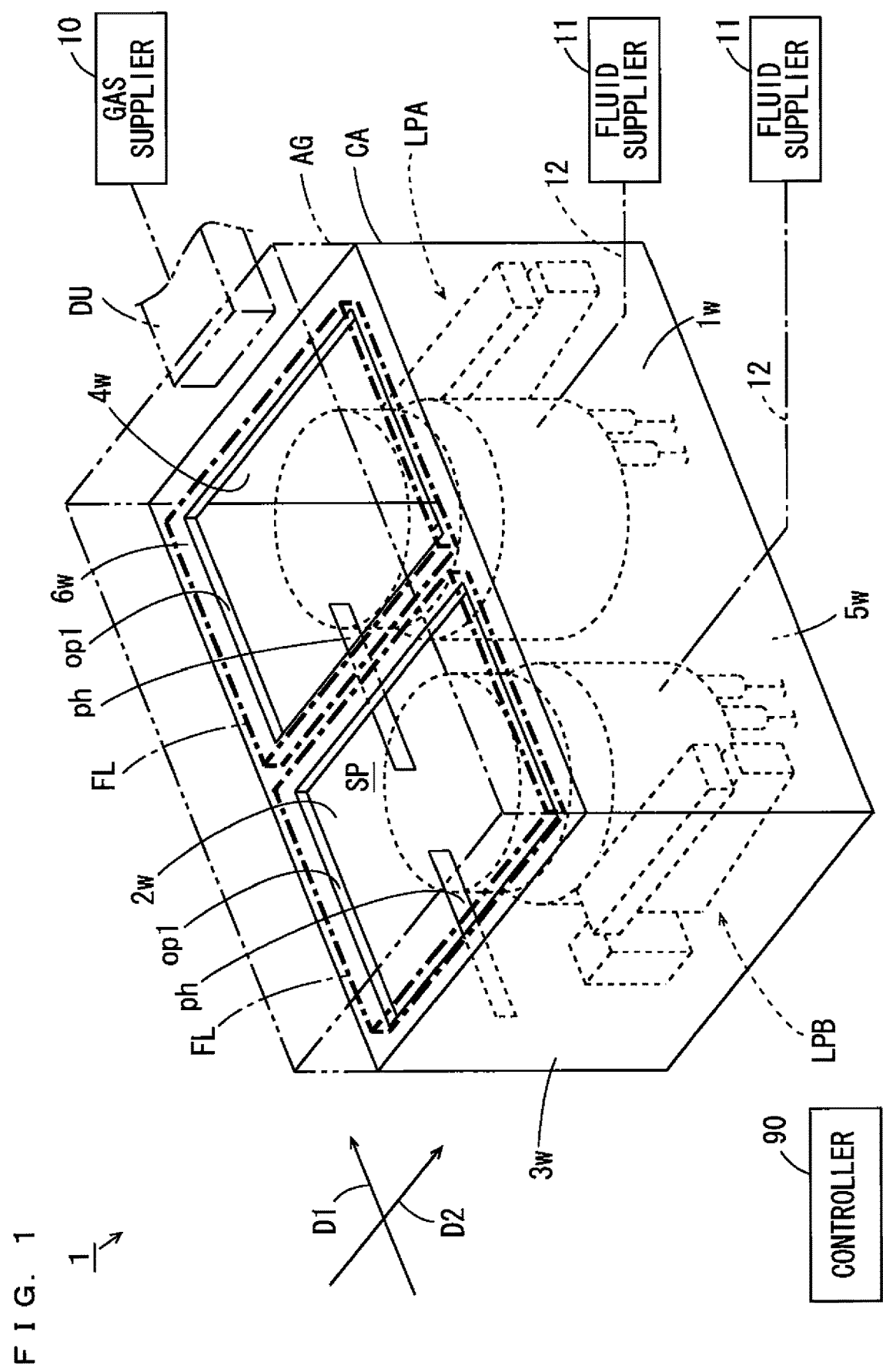
FIG. 1 is a schematic perspective view for explaining the schematic configuration of a development device according to one embodiment of the present invention.

FIG. 1 is a schematic perspective view for explaining the schematic configuration of a development device according to one embodiment of the present invention. As shown in FIG. 1, the development device 1 basically has the configuration in which two liquid processing units LPA, LPB are contained in a casing CA. In FIG. 1, the schematic shapes of the two liquid processing units LPA, LPB are indicated by the dotted lines. Details of the configuration of the liquid processing units LPA, LPB will be described below.

The casing CA has a substantially cuboid box shape extending in one direction in a horizontal plane. Specifically, a first sidewall plate 1w, a second sidewall plate 2w, a third sidewall plate 3w, a fourth sidewall plate 4w, a bottom plate 5w and a top plate 6w are attached to a frame (not shown) to form the casing CA. In the following description, a direction parallel to the direction in which the casing CA extends in a horizontal plane is suitably referred to as a first direction D1, and a direction orthogonal to the first direction D1 in a horizontal plane is suitably referred to as a second direction D2. The two liquid processing units LPA, LPB are arranged on the bottom plate 5w so as to be aligned in the first direction D1 in the casing CA.

The first and second sidewall plates 1w, 2w have a rectangular plate shape and are provided so as to be parallel to the vertical direction and the first direction D1 and face each other. The third and fourth sidewall plates 3w, 4w have a rectangular plate shape and are provided so as to be parallel to the vertical direction and the second direction D2 and face each other.

In the second sidewall plate 2w, two carry-in carry-out ports ph for transporting a substrate between the inside and outside of the casing CA are formed. The two carry-in carry-out ports ph are respectively formed in two portions opposite to the liquid processing units LPA, LPB in the second direction D2 in the second sidewall plate 2w. In the top plate 6w, two openings op1 are formed to be aligned in the first direction D1. The aperture ratio of the two openings op1 in the top plate 6w is set as sufficiently large as the aperture ratio of when the entire upper end of the casing CA is opened upwardly.

Two filters FL are provided above the top plate 6w so as to respectively close the two openings op1 of the top plate 6w. The two filters FL may be provided immediately below the top plate 6w. In FIG. 1, the two filters FL are indicated by the thick one-dot and dash lines. The two filters FL are ULPA (Ultra-Low Penetration Air) filters, for example, and are attached to a frame (not shown) that constitutes the casing CA or the top plate 6w. An air guide AG is provided on the top plate 6w of the casing CA so as to surround the two filters FL. In FIG. 1, the air guide AG is indicated by the two-dots and dash lines.

A gas supplier 10 is provided outside of the casing CA. The gas supplier 10 is an air control unit, for example, and regulates the conditions of air such as a temperature and humidity so as to satisfy a predetermined condition during power-on of the development device 1. Further, the gas supplier 10 supplies air the conditions of which are regulated to the air guide AG through a duct DU. In this case, the air guide AG guides the air supplied from the gas supplier 10 to the two openings op1 of the top plate 6w through the two filters FL. Thus, a clean air the temperature, humidity and the like of which are regulated is supplied into the casing CA, and a downward airflow is generated in an entire internal space SP of the casing CA.

Two fluid suppliers 11 are further provided outside of the casing CA. Each fluid supplier 11 includes a development liquid supply source, a rinse liquid supply source, a gas supply source and various fluid-related elements and supplies a development liquid, a rinse liquid and gas to the liquid processing units LPA, LPB through a fluid supply path 12. In FIG. 1, the fluid supply path 12 is indicated by the one-dot and dash line. In the present embodiment, the fluid supply path 12 is constituted by one or a plurality of pipes, a valve and the like.

The development device 1 further includes a controller 90. The controller 90 includes a CPU (Center Processing Unit) and a memory, or a microcomputer, for example, and controls the liquid processing units LPA, LPB and the two fluid suppliers 11. Details of the controller 90 will be described below.

Figure 2:
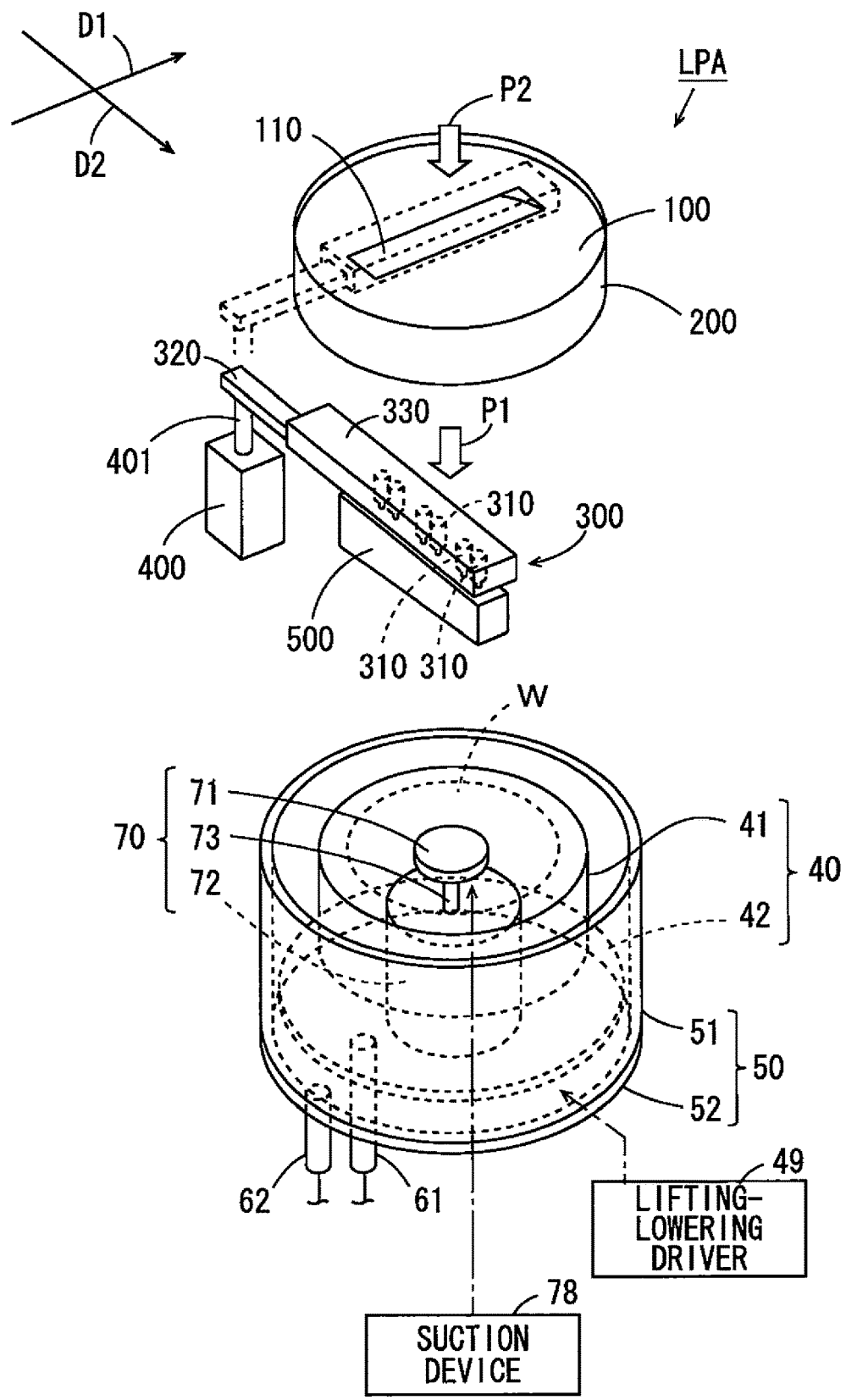
FIG. 2 is a partially exploded perspective view for explaining the configuration of a liquid processing unit of FIG. 1.
Figure 3:
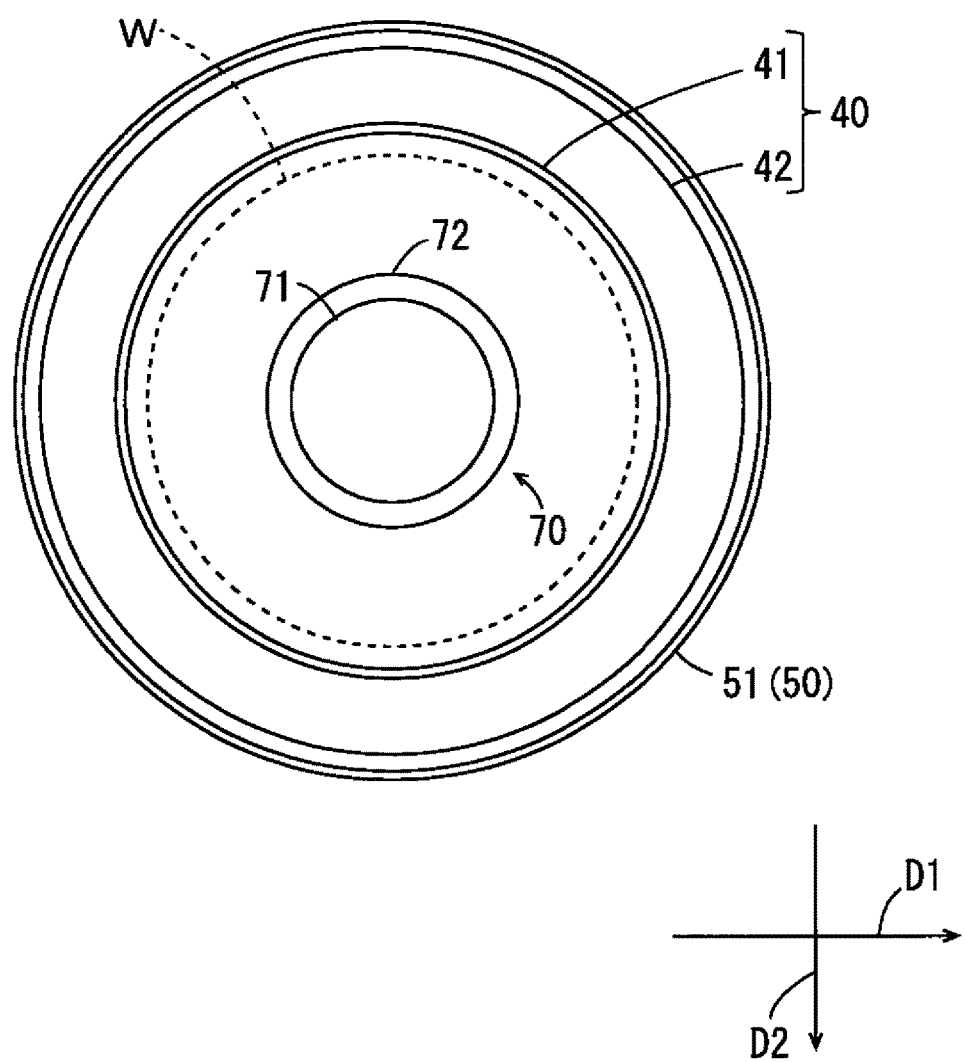
FIG. 3 is a schematic plan view for explaining the configuration of part of the liquid processing unit of FIG. 2.
Figure 4:
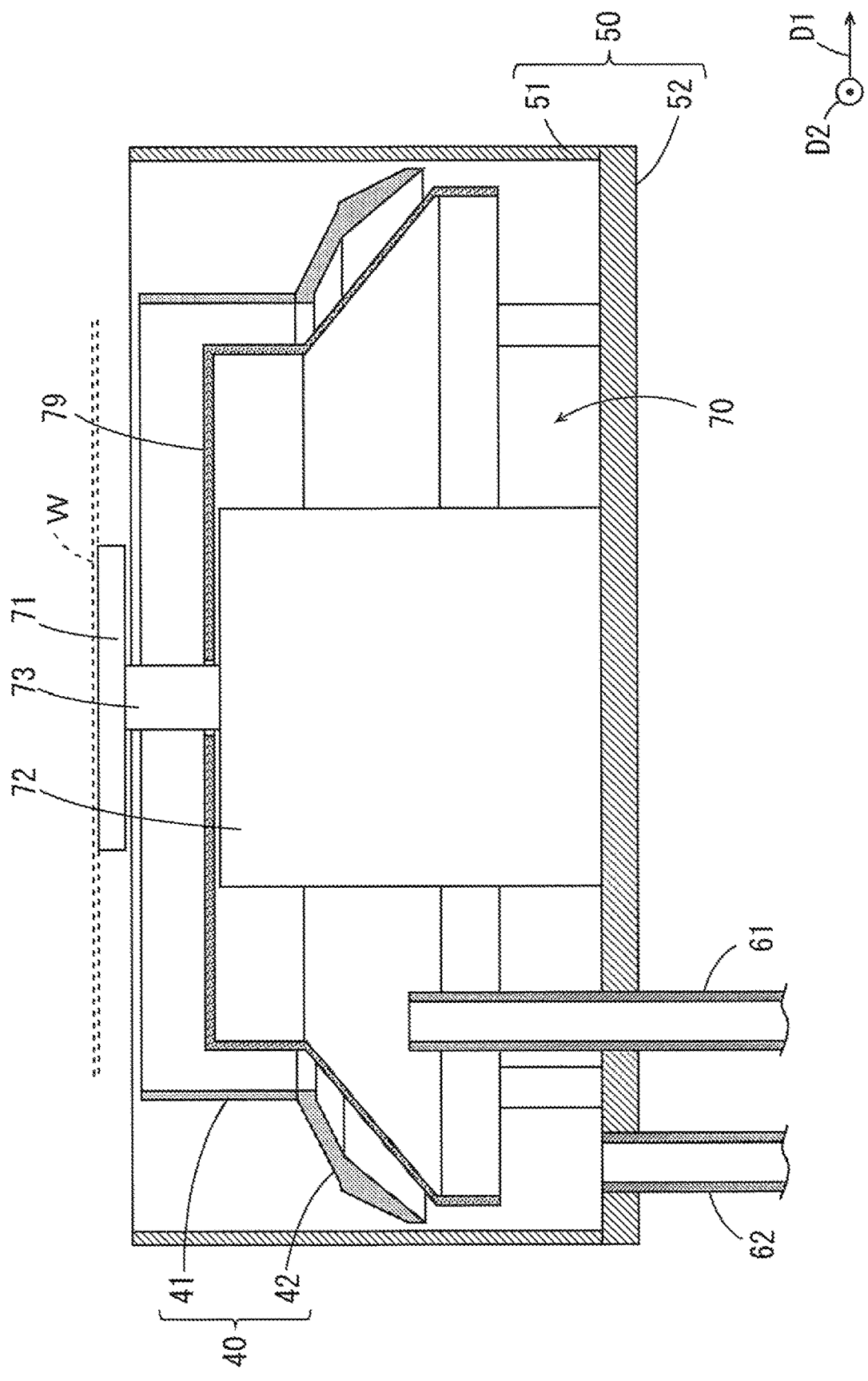
FIG. 4 is a schematic longitudinal cross sectional view for explaining the configuration of part of the liquid processing unit of FIG. 2.

<2> Configuration of Liquid Processing Units (1) Outline of Configuration of Liquid Processing Units LPA, LPB The two liquid processing units LPA, LPB of FIG. 1 basically have the same configuration except that parts of constituent elements are provided to be symmetrical to each other with respect to a plane (vertical plane) orthogonal to the first direction D1. The configuration of the liquid processing unit LPA out of the two liquid processing units LPA, LPB will be described below representatively. FIG. 2 is a partially exploded perspective view for explaining the configuration of the liquid processing unit LPA of FIG. 1, FIG. 3 is a schematic plan view for explaining the configuration of part of the liquid processing unit LPA of FIG. 2, and FIG. 4 is a schematic longitudinal cross sectional view for explaining the configuration of part of the liquid processing unit LPA of FIG. 2. In FIGS. 2 to 4, a substrate W to be processed is indicated by the dotted lines.

As shown in FIG. 2, the liquid processing unit LPA includes a partition plate 100, a cylindrical member 200, a nozzle arm unit 300, a nozzle driver 400 and a waiting pod 500. Further, the liquid processing unit LPA further includes a cup 40, a lifting-lowering driver 49, a container 50, an exhaust pipe 61, a drain pipe 62, a substrate holding device 70 and a suction device 78. In FIG. 2, in order to facilitate understanding of the structure of the plurality of constituent elements, parts of the constituent elements are shown in the upper field, and the rest of the constituent elements is shown in the lower field. Specifically, in FIG. 2, the parts of the constituent elements including the partition plate 100, the cylindrical member 200, the nozzle arm unit 300, the nozzle driver 400 and the waiting pod 500 are shown in the upper field, and the rest of the constituent elements including the cup 40, the container 50 and the substrate holding device 70 is shown in the lower field. In FIGS. 3 and 4, the schematic plan view and the schematic longitudinal cross sectional view of the cup 40, the container 50 and the substrate holding device 70 are respectively shown as the partial configuration of the liquid processing unit LPA. In the partition plate 100 shown in FIG. 2, a plurality of through holes H (FIG. 8), described below, are not shown.

(2) Cup 40 and Container 50

In the casing CA of FIG. 1, the container 50 is fixed to the bottom plate 5w (FIG. 1). As shown in FIG. 2, the container 50 includes a sidewall portion 51 and a bottom portion 52. The sidewall portion 51 has an annular horizontal cross section, and is formed to extend in the vertical direction while having a constant inner diameter and a constant outer diameter. The bottom portion 52 is formed so as to close the lower end of the sidewall portion 51.

Two through holes are formed in the bottom portion 52. The exhaust pipe 61 is connected to the portion of the bottom portion 52 in which one through hole is formed. The exhaust pipe 61 guides an atmosphere in the casing CA to an exhaust device (not shown) provided outside of the casing CA. In the container 50, an end portion (opening end) of the exhaust pipe 61 is located farther upwardly than the bottom portion 52.

The drain pipe 62 is further connected to the portion of the bottom portion 52 in which the other through hole is formed. During the development processing for the substrate W, the drain pipe 62 guides the liquids (the development liquid and the rinse liquid) flowing from the cup 40 to a bottom portion of the container 50 to a drain device (not shown) provided outside of the casing CA as described below. In the container 50, an end portion (opening end) of the drain pipe 62 is located farther downwardly than the end portion of the exhaust pipe 61.

At least a lower portion of the substrate holding device 70 is contained in the container 50. Specifically, the substrate holding device 70 includes a suction holder 71, a spin motor 72 and a motor cover 79 (FIG. 4). In FIGS. 2 and 3, the motor cover 79 is not shown. As shown in FIG. 3, the spin motor 72 is fixed onto the bottom portion 52 so as to be located at the center of the container 50 in a plan view. As shown in FIG. 4, a rotation shaft 73 is provided at the spin motor 72 to extend upwardly. The suction holder 71 is provided at the upper end of the rotation shaft 73. The suction holder 71 projects farther upwardly than the upper end of the container 50.

As shown in FIG. 2, the suction device 78 is provided outside of the container 50. The suction holder 71 is configured to be capable of sucking the center portion of the back surface of the substrate W by an operation of the suction device 78. The suction holder 71 sucks the center portion of the back surface of the substrate W, so that the substrate W is held in a horizontal posture at a position above the container 50. Further, the spin motor 72 operates with the substrate W held by suction by the suction holder 71, so that the substrate W is rotated in a horizontal posture.

As shown in FIG. 4, the motor cover 79 substantially has a bowl shape, and is fixed to the container 50 such that an open large-diameter portion is directed downwardly. A through hole into which the rotation shaft 73 is insertable is formed in the center portion of the upper end of the motor cover 79. With the rotation shaft 73 inserted into the through hole in the center portion of the upper end of the motor cover 79, the motor cover 79 covers an upper end portion of the spin motor 72 excluding the rotation shaft 73 and a space having a constant width and surrounding the spin motor 72 in a horizontal plane from above. A gap having a constant width is formed between the outer peripheral end of the motor cover 79 and the inner peripheral surface of the sidewall portion 51.

Here, the above-mentioned end portion of the exhaust pipe 61 is located below the motor cover 79. This prevents the liquids (the development liquid and the rinse liquid) falling from above the container 50 from entering the exhaust pipe 61 during the development processing for the substrate W.

As shown in FIG. 2, at least the lower end of the cup 40 is contained in the container 50 in addition to the lower portion of the substrate holding device 70. Here, the cup 40 is configured to be movable in the vertical direction in the container 50. Further, the cup 40 includes a cylindrical wall portion 41 and a liquid receiving portion 42. Each of the cylindrical wall portion 41 and the liquid receiving portion 42 has an annular horizontal cross section and is provided to extend at least in the vertical direction. As shown in FIG. 3, the cup 40 is configured to surround the substrate holding device 70 in a plan view.

As shown in FIG. 4, the outer diameter and the inner diameter of the liquid receiving portion 42 gradually increase downwardly from the upper end of the liquid receiving portion 42. The outer diameter of the lower end of the liquid receiving portion 42 (the largest outer diameter of the liquid receiving portion 42) is smaller than the inner diameter of the sidewall portion 51 of the container 50. Therefore, a gap having a constant width is formed between the outer peripheral end of the liquid receiving portion 42 and the inner peripheral surface of the sidewall portion 51. The cylindrical wall portion 41 has a constant inner diameter and a constant outer diameter and is formed to extend upwardly from the upper end of the liquid receiving portion 42.

As shown in FIG. 2, the lifting-lowering driver 49 is provided in the vicinity of the container 50 in the casing CA of FIG. 1. The lifting-lowering driver 49 includes a driving mechanism such as a motor or an air cylinder, and changes the cup 40 between a first state and a second state by supporting the cup 40 and vertically moving the cup 40. The first state and the second state of the cup 40 will be described below.

(3) Nozzle Driver 400 and Waiting Pod 500

In the casing CA of FIG. 1, the nozzle driver 400 is provided to be adjacent to the container 50 in the first direction D1. The nozzle driver 400 includes a motor having a rotation shaft 401 and an actuator. The actuator includes an air cylinder, a hydraulic cylinder, a motor or the like and supports the motor on the bottom plate 5w (FIG. 1) such that the motor having the rotation shaft 401 is movable in the vertical direction. The rotation shaft 401 is located at the upper end of the nozzle driver 400.

In the casing CA of FIG. 1, the waiting pod 500 is further provided on the bottom plate 5w (FIG. 1). The nozzle driver 400 and the waiting pod 500 are aligned in the second direction D2 close to the container 50 with a distance therebetween. The waiting pod 500 has a box shape extending by a constant length in the second direction D2. A plurality of waiting holes 510 (FIG. 10) for containing injecting portions 310c (FIG. 6) of a plurality of nozzles 310 (FIG. 6), described below, are formed in the upper surface of the waiting pod 500.

A drain pipe (not shown) that drains liquid injected or falling from the plurality of nozzles 310 (FIG. 6) to the outside of the casing CA when the plurality of nozzles 310 (FIG. 6) are waiting is connected to the waiting pod 500. Further, an exhaust pipe (not shown) that exhausts an atmosphere in the waiting pod 500 to the outside of the casing CA is connected to the waiting pod 500.

(4) Nozzle Arm Unit 300

The nozzle arm unit 300 is attached to the upper end of the rotation shaft 401. The nozzle arm unit 300 has a longitudinal shape extending linearly in a direction different from the direction in which the rotation shaft 401 extends while being attached to the upper end of the rotation shaft 401. The nozzle arm unit 300 is mainly constituted by the plurality (six in the present example) of nozzles 310, a support 320 and a cover member 330.

Figure 5:
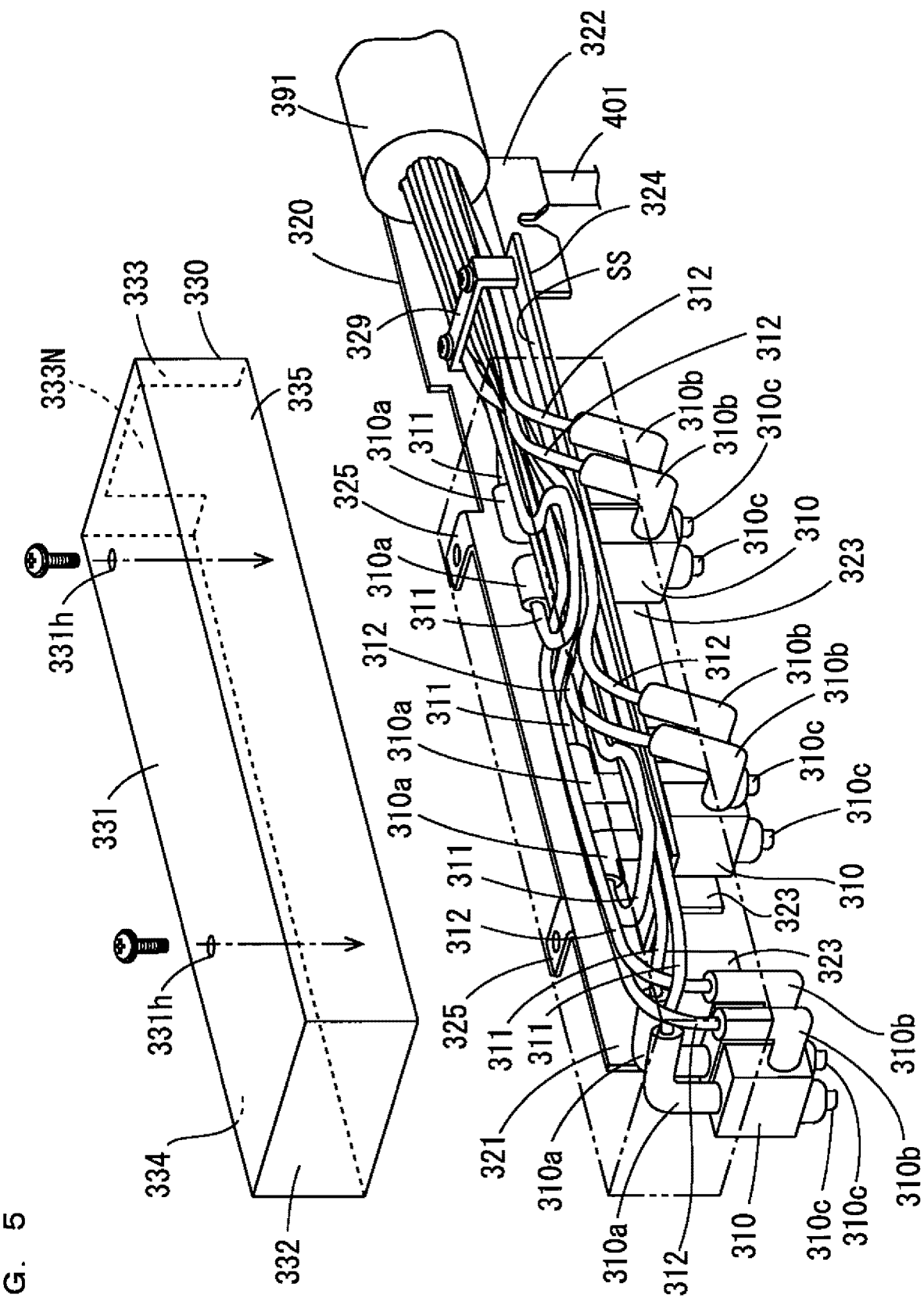
FIG. 5 is a perspective view of a nozzle arm unit of FIG. 2.
Figure 6:
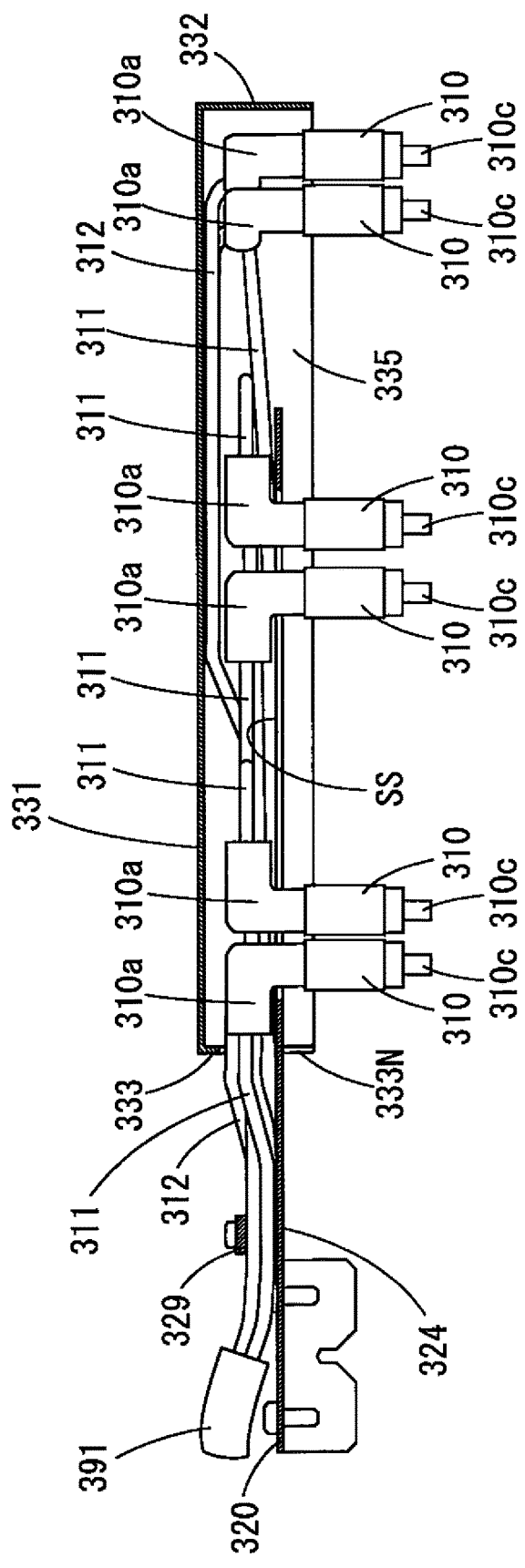
FIG. 6 is a longitudinal cross sectional view of the nozzle arm unit taken along a predetermined vertical plane.

FIG. 5 is a perspective view of the nozzle arm unit 300 of FIG. 2, and FIG. 6 is a longitudinal cross-sectional view of the nozzle arm unit 300 taken along the predetermined vertical plane (the vertical plane parallel to the direction in which the nozzle arm unit 300 extends). In FIG. 5, the cover member 330 being separated from the rest of the constituent elements is shown to facilitate understanding of the internal structure of the nozzle arm unit 300.

The support 320 is fabricated by suitable bending of one metal plate that has been cut or laser-processed into a predetermined shape, for example. Alternatively, the support 320 is fabricated by connection of a plurality of metal plates processed into a predetermined shape by screwing, welding or the like. Further, the support 320 is formed to extend in one direction and has one end portion 321 and the other end portion 322. Further, the support 320 has three nozzle fixing portions 323 which are aligned from the vicinity of the one end portion 321 toward the other end portion 322 at intervals. Two nozzles 310 are attached to each of the three nozzle fixing portions 323. Further, the support 320 includes a pipe fixing portion 324 and two cover attachment portions 325. The pipe fixing portion 324 is located in the vicinity of the other end portion 322. The pipe fixing portion 324 and the cover attachment portions 325 will be described below.

One of the two nozzles 310 provided at each nozzle fixing portion 323 is used to supply the development liquid to the substrate W. Further, the other one of the two nozzles 310 provided at each nozzle fixing portion 323 is used to supply a rinse liquid to the substrate W. Further, each of all of the nozzles 310 according to the present embodiment is a soft spray-type two-fluid nozzle capable of injecting a fluid mixture of liquid and gas. Therefore, each nozzle 310 has two fluid introducing portions 310a, 310b for introducing liquid and gas into the nozzle 310, and an injecting portion 310c for injecting a fluid mixture.

Each nozzle 310 is fixed to the support 320 with the injecting portion 310c directed downwardly. In this state, the fluid introducing portion 310a for introducing liquid into the nozzle 310 is provided at the upper end of each nozzle 310. Further, the fluid introducing portion 310b for introducing gas into the nozzle 310 is provided at a side portion of each nozzle 310.

One end of a pipe 311 for supplying liquid (the development liquid or the rinse liquid in the present example) to the nozzle 310 is connected to the fluid introducing portion 310a of each nozzle 310. Further, one end of a pipe 312 for supplying gas (a nitrogen gas in the present example) to the nozzle 310 is connected to the fluid introducing portion 310a of each nozzle 310. The pipes 311, 312 are formed of a flexible resin material. Examples of such a resin material are PTFE (polytetrafluoroethylene), PVC (polyvinyl chloride), PPS (polyphenylene sulfide), PFA (tetrafluoroethylene-perfluoro alkyl vinyl ether copolymer) and the like.

The other end portion 322 of the support 320 is attached to the upper end of the rotation shaft 401 of the nozzle driver 400. In this state, a horizontal flat support surface SS is formed at the substantially center portion in the longitudinal direction of the support 320. Part of each of the plurality of pipes 311, 312 is provided so as to extend on the support surface SS from the nozzle 310 to which the pipe is connected toward the pipe fixing portion 324.

The pipe fixing portion 324 is constituted by part of the support surface SS. In the pipe fixing portion 324, the plurality of pipes 311, 312 are bound. In this state, a pipe fixing piece 329 having an inverted U-shape is screwed onto the support surface SS constituting the pipe fixing portion 324. Therefore, the plurality of pipes 311, 312 are fixed in the vicinity of the other end portion 322 of the support 320. Portions of the plurality of pipes 311, 312 extending outwardly of the support 320 from the pipe fixing portion 324 are contained in a cylindrical binding member 391 while being bound. The cylindrical binding member 391 is formed of rubber or resin, for example, and is flexible.

The cover member 330 has a box shape with an open bottom portion. Specifically, the cover member 330 of the present example includes an upper surface portion 331, one end-surface portion 332, another end-surface portion 333, one side-surface portion 334 and another side-surface portion 335. The upper surface portion 331 is an oblong that is larger than a nozzle opening 110 (FIG. 7) of the below-mentioned partition plate 100 in a plan view. The one end-surface portion 332, the other end-surface portion 333, the one side-surface portion 334 and the other side-surface portion 335 extend downwardly from the four sides of the outer edge of the upper surface portion 331. The one end-surface portion 332 and the other end-surface portion 333 face each other, and the one side-surface portion 334 and the other side-surface portion 335 face each other. A cutout 333N is formed in the other end-surface portion 333.

As described above, the support 320 has the two cover attachment portions 325. The two cover attachment portions 325 are located at the upper end of the support 320. A screw hole is formed in each cover attachment portion 325. In the upper surface portion 331 of the cover member 330, through holes 331h are formed in two portions corresponding to the two cover attachment portions 325 of the support 320.

With the plurality of nozzles 310 attached to the support 320, the plurality of pipes 311, 312 connected to the plurality of nozzles 310 and the plurality of pipes 311, 312 fixed, the cover member 330 is attached to the support 320. Specifically, the two through holes 331h of the cover member 330 are positioned on the two cover attachment portions 325 of the support 320, and the cover member 330 is screwed to the support 320.

Thus, a portion of the support 320 from the one end portion 321 to the vicinity of the other end portion 322 is covered by the cover member 330 from above and the side. On the other hand, the remaining portion of the support 320 is drawn out through the cutout 333N formed in the other end-surface portion 333 of the cover member 330. In this manner, the part of the support 320 is contained in the cover member 330. Further, part of the plurality of nozzles 310 supported by the support 320 is contained in the cover member 330. Further, part of the plurality of pipes 311, 312 supported by the support 320 is contained in the cover member 330. In FIG. 5, the cover member 330 being attached to the support 320 is indicated by the two-dots and dash lines.

Here, in the support 320, the pipe fixing portion 324 is located between the other end portion 322 of the support 320 and the other end-surface portion 333 of the cover member 330. The pipe fixing piece 329 binds the plurality of pipes 311, 312 and fixes them to the pipe fixing portion 324 such that the plurality of pipes 311, 312 drawn out from the cover member 330 do not come into contact with the inner edge of the cutout 333N of the other end-surface portion 333.

As shown in FIG. 6, with the cover member 330 attached to the support 320, a large portion of each nozzle 310 except for the fluid introducing portion 310a projects downwardly of the cover member 330.

(5) Partition Plate 100 and Cylindrical Member 200

Figure 7:
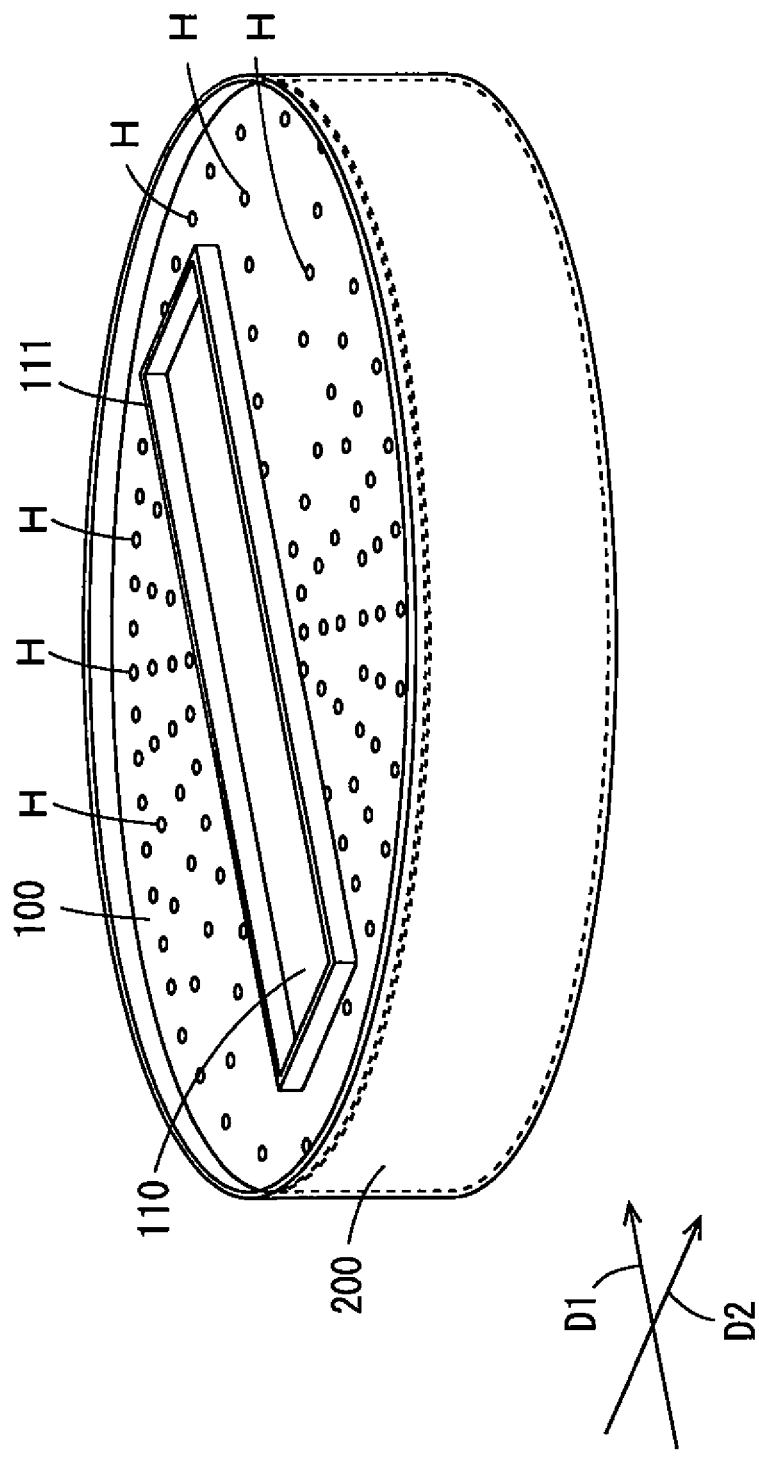
FIG. 7 is an external perspective view of a partition plate and a cylindrical member of FIG. 2.

FIG. 7 is an external perspective view of the partition plate 100 and the cylindrical member 200 of FIG. 2, and FIG. 8 is a plan view of the partition plate 100 and the cylindrical member 200 of FIG. 2. As shown in FIGS. 7 and 8, the cylindrical member 200 has a cylindrical shape and is fixed to part of the casing CA (FIG. 1) via a bracket (not shown). The inner diameter of the cylindrical member 200 is larger than the outer diameter of the cylindrical wall portion 41 (FIG. 3) of the cup 40. Further, the cylindrical member 200 is positioned such that the center axis of the cylindrical member 200 coincides or substantially coincides with the center axis of the cup 40 in a plan view. Thus, in a case in which the cup 40 is lifted, for example, it is possible to insert the upper end of the cup 40 into the cylindrical member 200 while preventing the cup 40 from coming into contact with the cylindrical member 200.

The partition plate 100 has a substantially disc shape and is attached to the cylindrical member 200 so as to come into contact with the entire inner peripheral surface of the cylindrical member 200 in the vicinity of the upper end of the cylindrical member 200. The oblong nozzle opening 110 extending in the first direction D1 is formed in the substantially center portion of the partition plate 100. The nozzle opening 110 is opposite to the center portion of the substrate W held by the substrate holding device 70 during the development processing for the substrate W. As shown in FIG. 7, a wall portion 111 extending upwardly from the inner edge of the nozzle opening 110 by a constant length (about 5 mm to 10 mm, for example) is formed in the portion of the partition plate 100 in which the nozzle opening 110 is formed.

As shown in FIG. 8, a plurality of through holes H are formed in the partition plate 100 so as to be dispersed over the entire partition plate 100 except for the nozzle opening 110. The number and size of the plurality of through holes H formed in the partition plate 100 are defined in consideration of the pressure relationship between a processing space Spa (FIG. 15) and a non-processing space SPb (FIG. 15), described below.

Specifically, in regard to the arrangement of the plurality of through holes H, as indicated by the dotted lines in FIG. 8, concentric circles (a plurality of virtual circles vc1) having a predetermined pitch are defined on the basis of a partition plate center 100C in a plan view. In this case, the plurality of through holes H are dispersedly formed so as to be aligned at equal intervals on each virtual circle vol. Further, the number of through holes H formed on the largest virtual circle vc1 among the plurality of virtual circles vc1 is larger than the number of through holes H formed on each of the rest of the virtual circles vc1. Further, in the present example, only the largest virtual circle vc1 among the plurality of virtual circles vc1 surrounds the entire nozzle opening 110. Therefore, in the largest virtual circle vc1, a plurality of through holes H are formed so as to be aligned at constant intervals over the entire virtual circle vol.

Further, as indicated by the thick two-dots and dash line in FIG. 8, a virtual circle vc2 having a radius of ½ of the radius of the partition plate 100 is defined with the partition plate center 100C as the center. Here, in a case in which the inner region of the virtual circle vc2 is a center region A1, and the outer region of the virtual circle vc2 is an outer peripheral region A2, the number of the through holes H formed in the outer peripheral region A2 is larger than the number of the through holes H formed in the center region A1.

(6) Operation of Nozzle Arm Unit 300

As described above, the nozzle arm unit 300 is attached to the rotation shaft 401 of the nozzle driver 400. Therefore, when the motor of the nozzle driver 400 moves in the vertical direction, the nozzle arm unit 300 moves in the vertical direction. Further, when the motor of the nozzle driver 400 is operated, the nozzle arm unit 300 rotates in a horizontal plane around the rotation shaft 401. Thus, the plurality of nozzles 310 of the nozzle arm unit 300 are held at a waiting position P1 close to the substrate W held by the substrate holding device 70 in a period during which the developing processing is not performed on the substrate W. Further, the plurality of nozzles 310 are held at a processing position P2 above the substrate W held by the substrate holding device 70 in a period during which the developing processing is performed on the substrate W. In FIG. 2, the waiting position P1 and the processing position P2 are respectively indicated by the outlined arrows.

FIGS. 9 to 12 are diagrams for explaining the operation of the nozzle arm unit 300 when the plurality of nozzles 310 move between the waiting position P1 and the processing position P2. In FIGS. 9 to 12, the states of the nozzle arm unit 300 and its peripheral members of when the plurality of nozzles 310 move from the waiting position P1 to the processing position P2 are shown in external perspective views in a chronological order. In the partition plate 100 shown in each of FIGS. 9 to 12, similarly to the example of FIG. 2, the plurality of through holes H are not shown.

Figure 9:
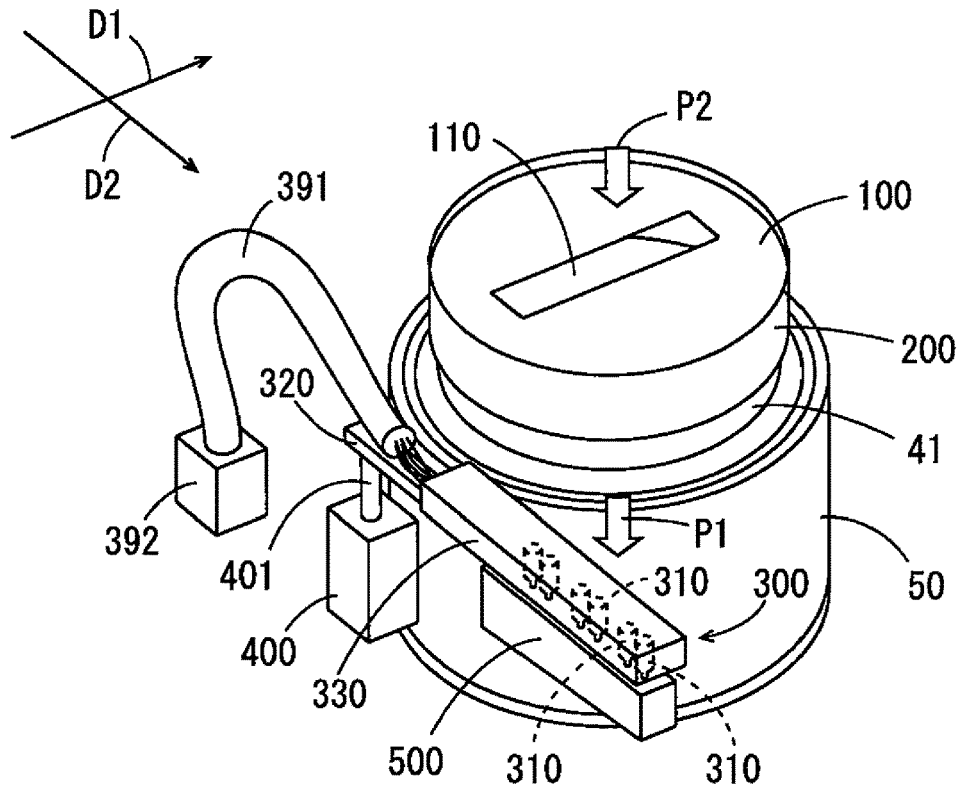
FIG. 9 is a diagram for explaining the operation of the nozzle arm unit when a plurality of nozzles move between a waiting position and a processing position.

First, as shown in FIG. 9, with the plurality of nozzles 310 located at the waiting position P1, the nozzle arm unit 300 is located close to the partition plate 100 and the cylindrical member 200 and held while extending parallel to the second direction D2. At this time, the nozzle arm unit 300 is positioned such that the injecting portions 310c (FIG. 6) of the plurality of nozzles 310 are contained in the plurality of waiting holes 510 (FIG. 10) of the waiting pod 500.

Figure 10:
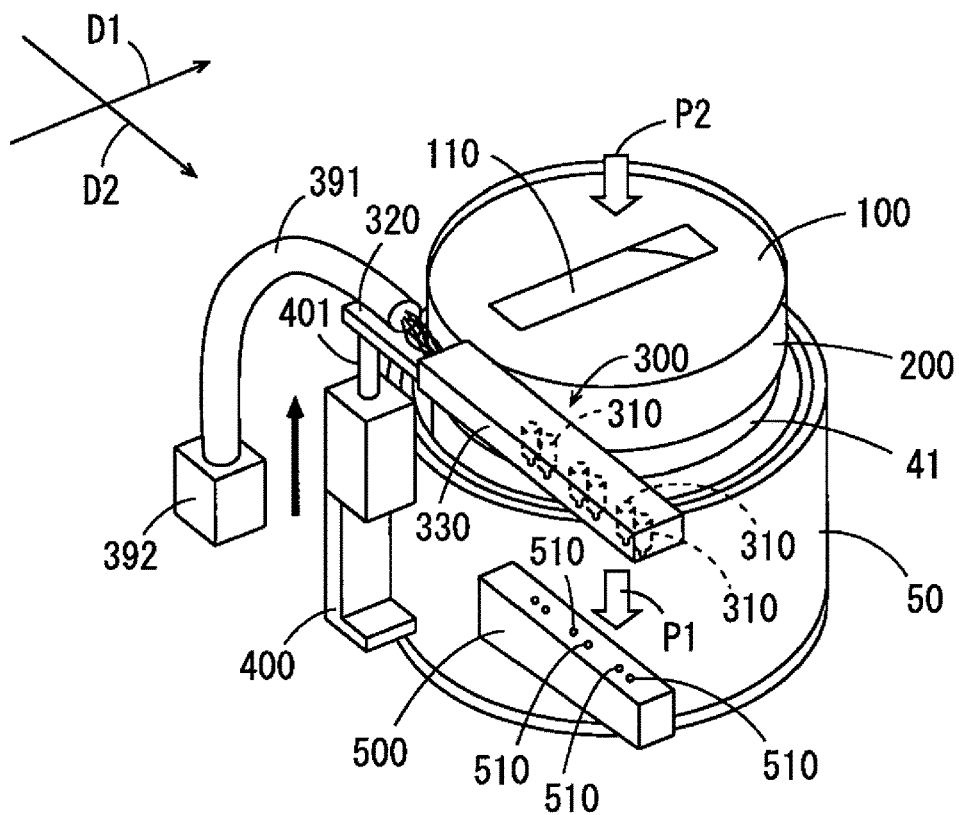
FIG. 10 is a diagram for explaining the operation of the nozzle arm unit when the plurality of nozzles move between the waiting position and the processing position.
Figure 11:
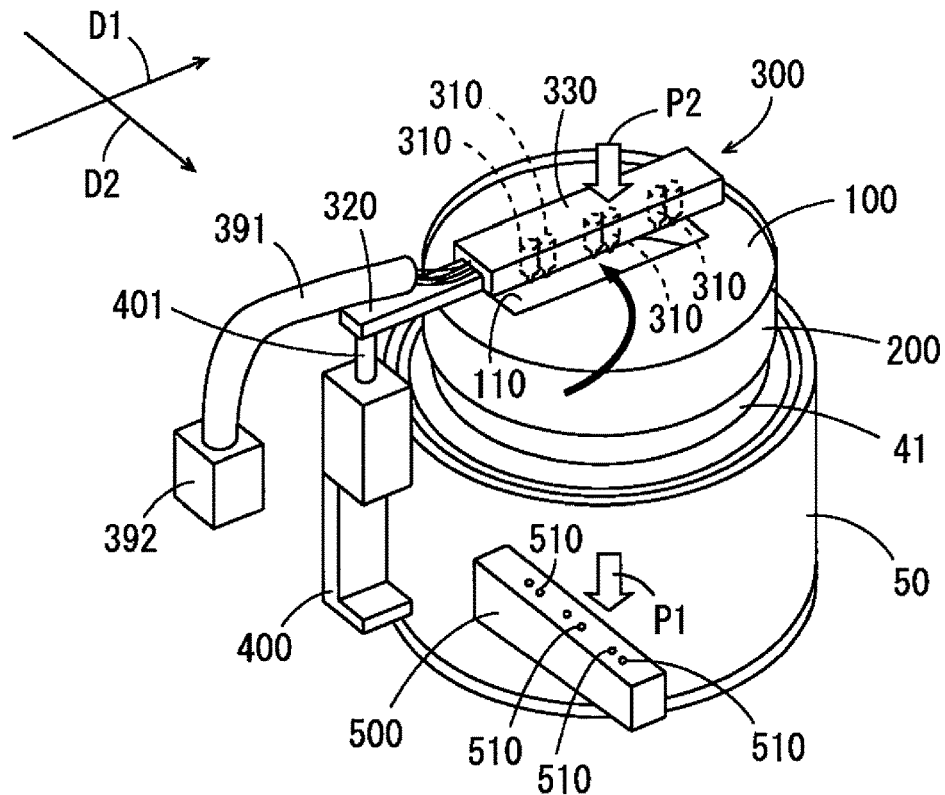
FIG. 11 is a diagram for explaining the operation of the nozzle arm unit when the plurality of nozzles move between the waiting position and the processing position.
Figure 12:
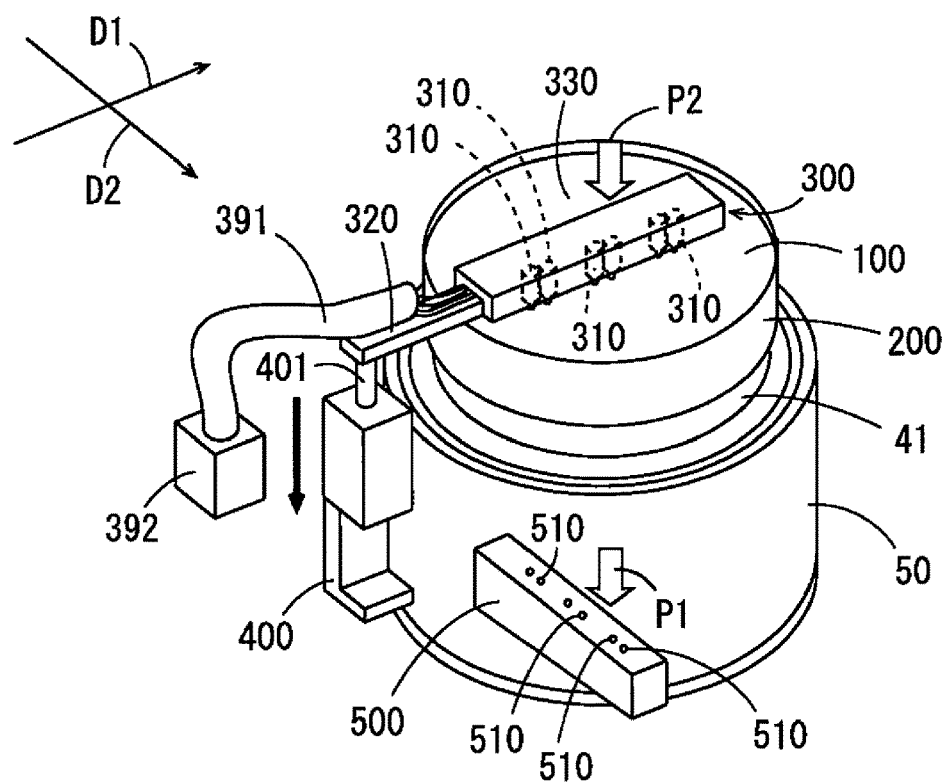
FIG. 12 is a diagram for explaining the operation of the nozzle arm unit when the plurality of nozzles move between the waiting position and the processing position.

When the nozzle driver 400 starts to operate in the state shown in FIG. 9, the nozzle arm unit 300 is lifted to a height position farther upward than the cylindrical member 200 together with the rotation shaft 401 as indicated by the thick solid arrow in FIG. 10. Thus, the injecting portions 310c (FIG. 6) of the plurality of nozzles 310 are drawn out from the plurality of waiting holes 510 (FIG. 10) of the waiting pod 500.

Next, the rotation shaft 401 of the nozzle driver 400 rotates by a predetermined angle (90° in the present example). Thus, the nozzle arm unit 300 rotates about the rotation shaft 401 as indicated by the thick solid arrow in FIG. 11. Thus, the nozzle arm unit 300 is held while extending parallel to the first direction D1. At this time, the nozzle arm unit 300 is positioned such that the cover member 330 overlaps with the nozzle opening 110 of the partition plate 100 in a plan view.

Next, the rotation shaft 401 of the nozzle driver 400 is lowered. Thus, the cover member 330 is lowered as indicated by the thick solid arrow in FIG. 12. At this time, the height position of the nozzle arm unit 300 is adjusted such that the cover member 330 does not come into contact with the partition plate 100 and is sufficiently close to the partition plate 100. This reduces a flow of gas in the nozzle opening 110. In this manner, with the nozzle opening 110 of the partition plate 100 covered by the cover member 330, the plurality of nozzles 310 are held at the processing position P2.

Portions of the plurality of pipes 311, 312 extending outwardly from the nozzle arm unit 300 are bound by the cylindrical binding member 391. As shown in FIGS. 9 to 12, a fixing portion 392 for fixing part of the cylindrical binding member 391 to part (the bottom plate 5w, for example) of the casing CA is provided in the casing CA of FIG. 1. The fixing portion 392 fixes the part of the cylindrical binding member 391 extending from the nozzle arm unit 300 to the casing CA. Thus, the plurality of pipes 311, 312 located between the nozzle arm unit 300 and the fixing portion 392 are deformably bound by the cylindrical binding member 391. Therefore, handleability of the plurality of pipes 311, 312 in the casing CA of FIG. 1 is improved. Further, because the cylindrical binding member 391 is flexible, a degree of freedom in regard to each of movement and rotation of the nozzle arm unit 300 is not limited by the cylindrical binding member 391. The plurality of pipes 311, 312 bound by the cylindrical binding member 391 are drawn out from the cylindrical binding member 391 in the vicinity of the fixing portion 392 and connected to the fluid supply path 12 of the fluid supplier 11 of FIG. 1.

(7) Operation of Cup 40

In the development device 1, the cup 40 is kept in the first state when the substrate W is carried into or carried out from the liquid processing unit LPA, LPB. On the other hand, during the development processing for the substrate W held by the substrate holding device 70, the cup 40 is kept in the second state. The first state and the second state of the cup 40 will be described.

Figure 13:
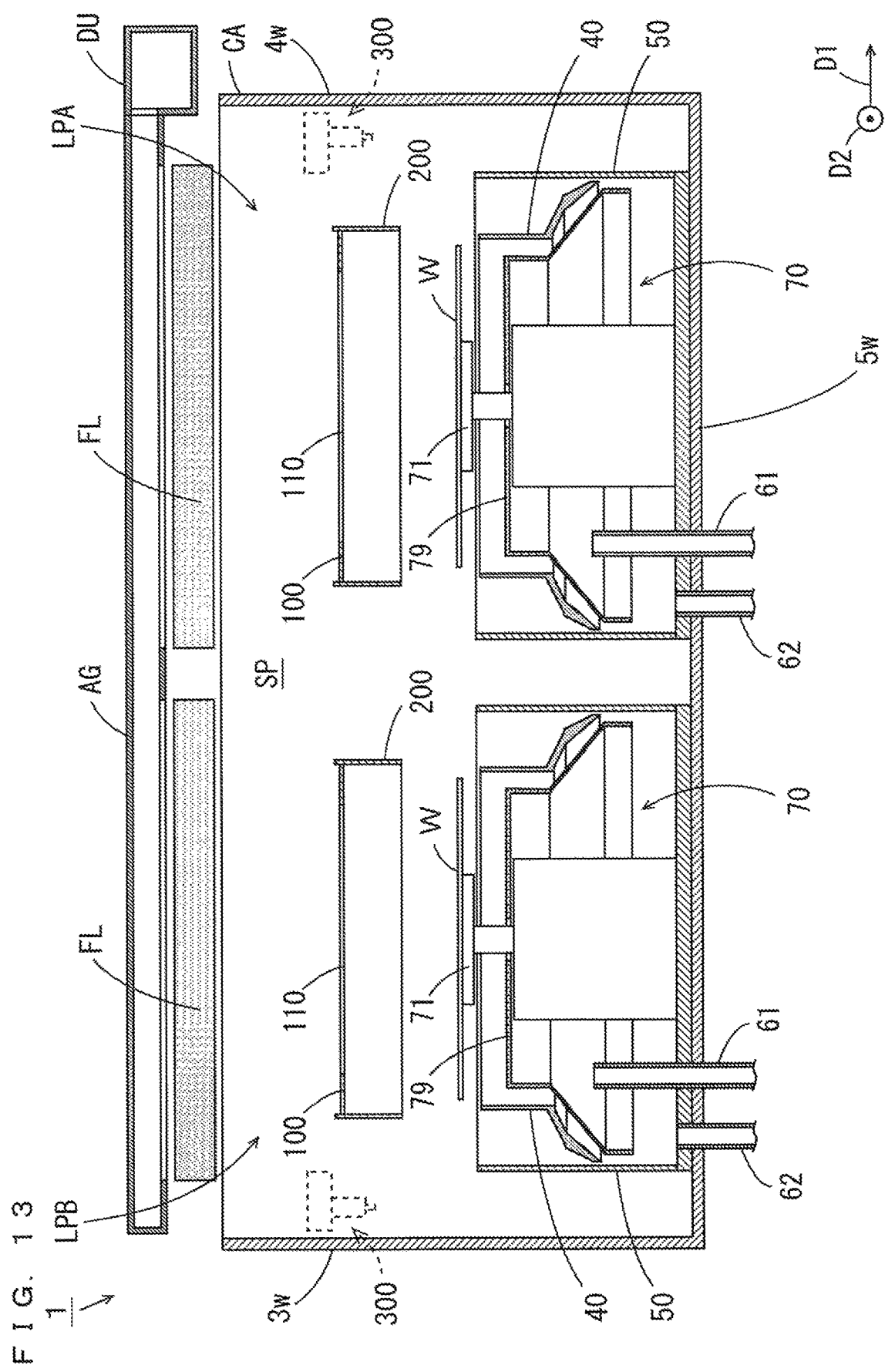
FIG. 13 is a schematic longitudinal cross sectional view of the development device when a cup of the liquid processing unit is in a first state.
Figure 14:
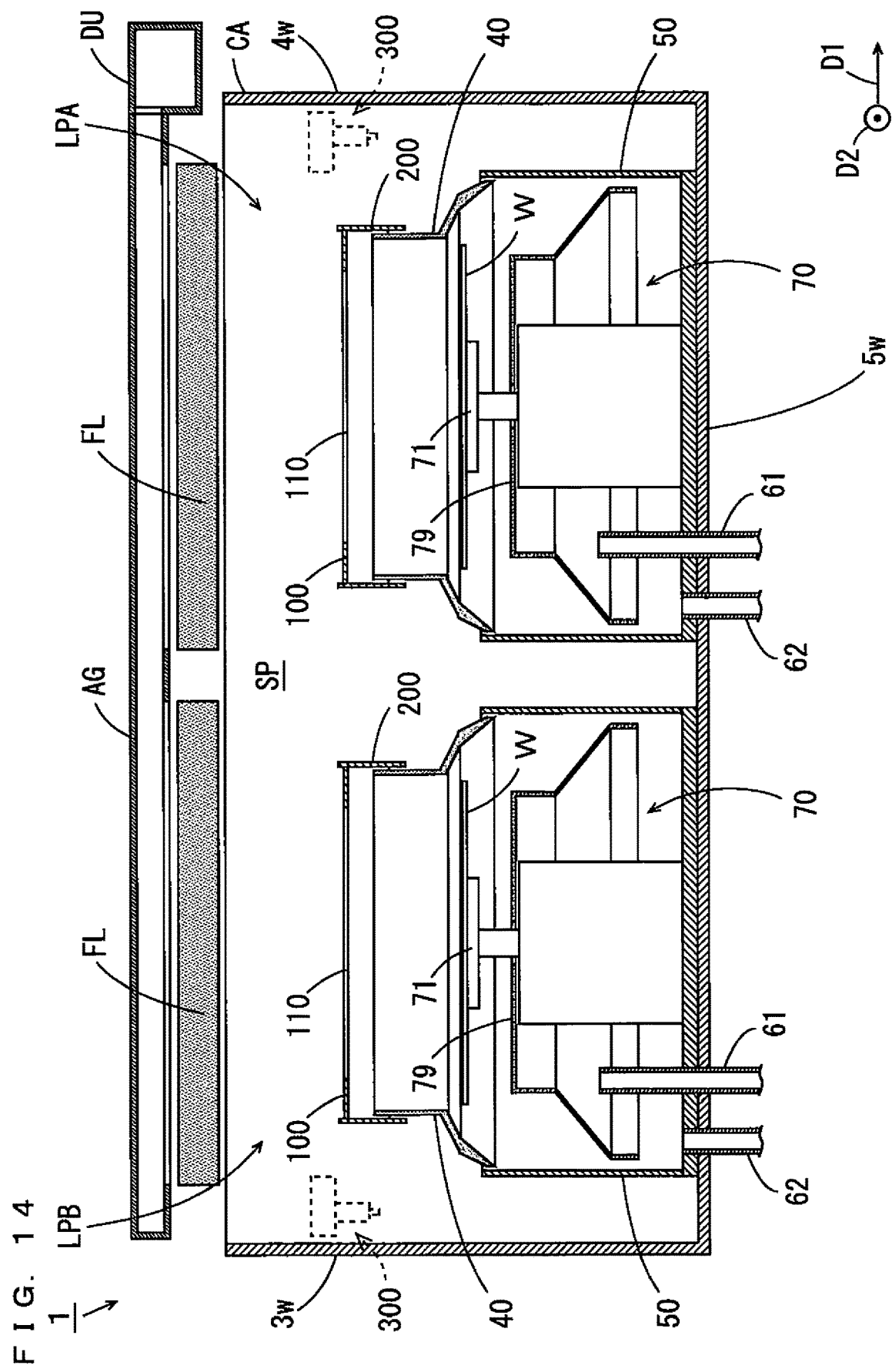
FIG. 14 is a schematic longitudinal cross sectional view of the development device when the cup of the liquid processing unit is in a second state.

FIG. 13 is a schematic longitudinal cross sectional view of the development device 1 when the cups 40 of the liquid processing units LPA, LPB are in the first state, and FIG. 14 is a schematic longitudinal cross sectional view of the development device 1 when the cups 40 of the liquid processing units LPA, LPB are in the second state. In FIGS. 13 and 14, each nozzle arm unit 300 located at the waiting position P1 is indicated by the dotted lines. Further, in FIGS. 13 and 14, part of the plurality of constituent elements of the liquid processing units LPA, LPB is not shown.

As shown in FIG. 13, when being in the first state, each cup 40 is located in each container 50. That is, when being in the first state, the cup 40 overlaps with the container in a side view and are separated from the cylindrical member 200. Therefore, when the cup 40 is in the first state, the substrate holding device 70 can be accessed from the side of the cup 40 and the container 50. Thus, the substrate W carried in from the outside of the development device 1 can be placed on the suction holder 71 of the liquid processing unit LPA, LPB. Further, the substrate W placed on the suction holder 71 of the liquid processing unit LPA, LPB can be taken out to be carried out from the development device 1.

The height (dimension in the vertical direction) of the cup 40 is set larger than the distance between the cylindrical member 200 and the container 50 in the vertical direction. As shown in FIG. 14, when being in the second state, the cup 40 overlaps with the lower end of the cylindrical member 200 and the upper end of the container 50 in a side view. At this time, the upper end of the cup 40 and the inner peripheral surface in the vicinity of the lower end of the cylindrical member 200 are close to each other. Further, the lower end of the cup 40 and the inner peripheral surface in the vicinity of the upper end of the container 50 are close to each other.

(8) Processing Space and Non-processing Space Formed in Casing CA

Figure 15:
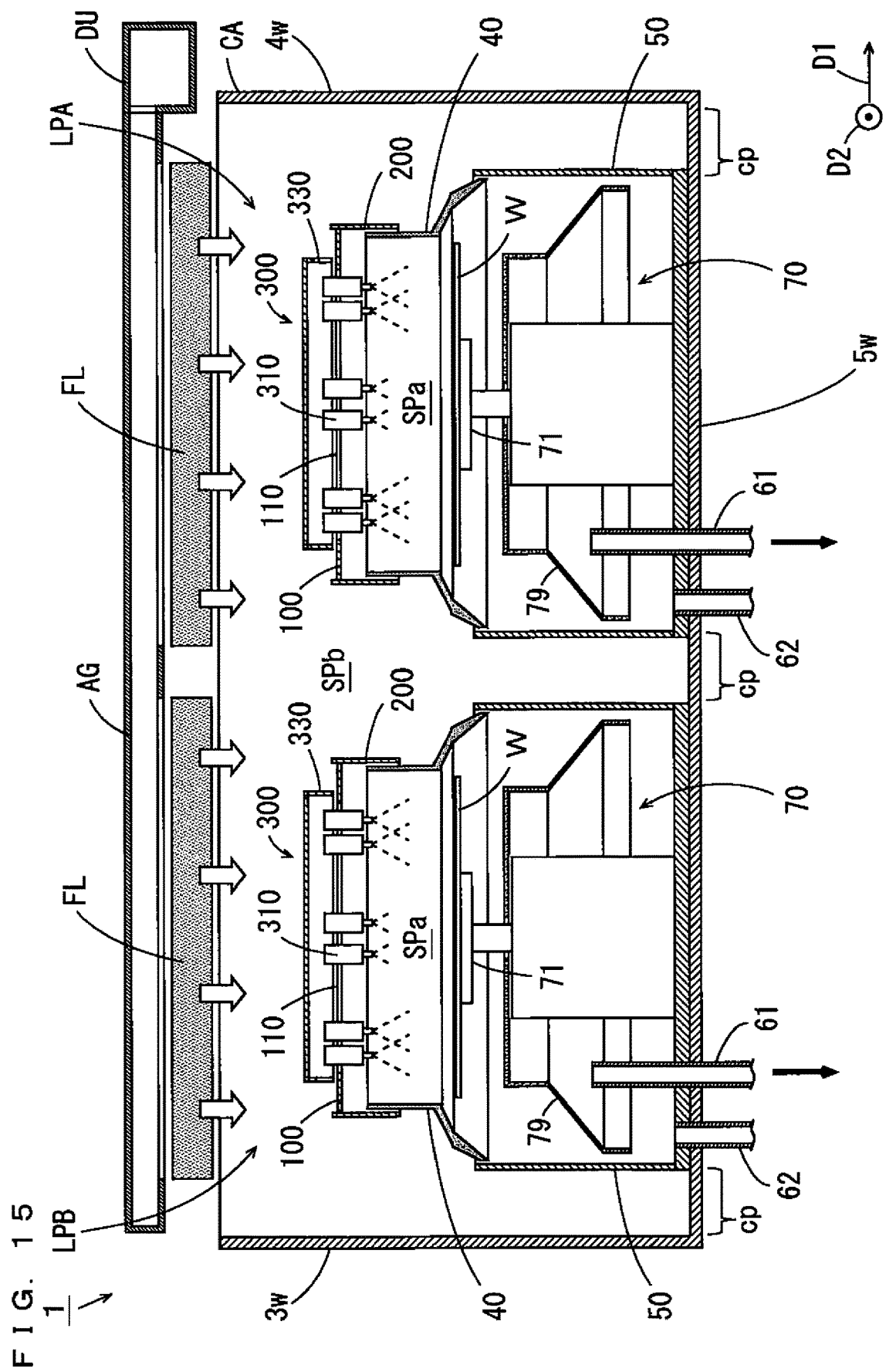
FIG. 15 is a schematic longitudinal cross sectional view of the development device during development processing for a substrate.

During the development processing for the substrate W, the cup 40 is held in the second state, and the plurality of nozzles 310 of the nozzle arm unit 300 are arranged at the processing position P2. FIG. 15 is a schematic longitudinal cross-sectional view of the development device 1 during the development processing for the substrates W. As shown in FIG. 15, during the developing processing for the substrates W, in each of the liquid processing units LPA, LPB, the plurality of nozzles 310 are arranged at the processing position P2 (FIG. 12), and the cover member 330 covers the nozzle opening 110 of the partition plate 100. Thus, the internal space SP of the casing CA is partitioned into the processing spaces SPa and the non-processing space SPb by the partition plates 100, the cylindrical members 200, the cover members 330, the cups 40 and the containers of the liquid processing units LPA, LPB. Each processing space SPa is a space including the substrate W held by each substrate holding device 70, and the non-processing space SPb is a space surrounding the processing spaces SPa.

As indicated by the outlined arrows in FIG. 15, clean air is continuously supplied to the non-processing space SPb from above. Further, part of the clean air supplied to the non-processing space SPb is supplied to the processing spaces SPa through the plurality of through holes H (FIG. 8) of the partition plates 100. Thus, in the casing CA, a downward flow of clean air is formed in each of the two processing spaces SPa and the non-processing space SPb.

The inner peripheral surface of the liquid receiving portion 42 of the cup 40 forming each processing space SPa surrounds the substrate W held by the substrate holding device 70 in a horizontal plane. Thus, large portions of the development liquid and the rinse liquid supplied to the substrate W from the plurality of nozzles 310 during the development processing for the substrate W are received by the inner peripheral surface of the liquid receiving portion 42 and guided to the container 50. On the other hand, splashes of the development liquid or the rinse liquid that are not received by the liquid receiving portion 42 and splash around the substrate W are guided to the container 50 by a downward airflow formed in the processing space SPa.

When the substrate W is rotated by the substrate holding device 70 in the processing space SPa, an airflow (upward airflow) directed from below toward above may be generated along the inner peripheral surfaces of the cup 40 and the cylindrical member 200 in the vicinity of the peripheral edge of the substrate W. In this case, when an atmosphere including splashes of the development liquid or the rinse liquid is lifted in the processing space SPa, these splashes may adhere to the lower surface of the partition plate 100 and the inner peripheral surface of the cylindrical member 200. Further, these splashes may re-adhere to the substrate W.

As such, as described with reference to FIG. 8, in a case in which concentric circles are defined in the partition plate 100, the partition plate 100 is fabricated such that the number of through holes H formed on the largest virtual circle vc1 is larger than the number of through holes H formed on each of the rest of the virtual circles vc1. Further, the partition plate 100 is fabricated such that the plurality of through holes H are dispersedly arranged at constant intervals over the entire largest virtual circle vc1 surrounding the nozzle opening 110. Alternatively, in a case in which the center region A1 and the outer peripheral region A2 are defined on the partition plate 100, the partition plate 100 is fabricated such that the number of through holes H formed in the outer peripheral region A2 is larger than the number of through holes H formed in the center region A1.

With the above-mentioned configuration of the partition plate 100, in the processing space SPa, an amount of a downward airflow guided to the vicinity of the inner peripheral surface of the cup 40 can be made larger than an amount of a downward airflow guided to the center portion of the substrate W. In particular, in a case in which the plurality of through holes H are dispersedly arranged at constant intervals over the entire largest virtual circle vc1 surrounding the nozzle opening 110, it is possible to form a downward airflow in the vicinity of the inner peripheral surface of the cup 40 over the entire circumference of the inner peripheral surface of the cup 40. This suppresses generation of an upward airflow in the vicinity of the inner peripheral surface of the cup 40 during rotation of the substrate W. Therefore, in the processing space SPa, upward splashing of the development liquid or the rinse liquid supplied to the substrate W in the vicinity of the outer peripheral end of the substrate W is suppressed. As a result, adherence of splashes of the development liquid or the rinse liquid to the lower surface of the partition plate 100 and the inner peripheral surface of the cylindrical member 200 is suppressed. Further, re-adherence of the development liquid or the rinse liquid to the substrate W is suppressed.

As shown in FIG. 15, in a case in which the processing spaces SPa and the non-processing space SPb are formed in the casing CA, a difference between the pressure in each of the processing spaces SPa and the pressure in the non-processing space SPb is generated. The reason will be described.

As described above, clean air is continuously supplied from above to the processing spaces SPa and the non-processing space SPb. However, an amount of a downward airflow that can enter the processing spaces SPa from above the casing CA is limited by the partition plates 100. Further, in the development device 1, the end portion of the exhaust pipe 61 for exhausting an atmosphere in the casing CA is located in the internal space of the container 50, that is, each processing space SPa. Therefore, an atmosphere in the processing space SPa is actively exhausted to the outside of the casing CA.

On the other hand, in the non-processing space SPb, a member, such as the partition plate 100, for limiting an amount of a downward airflow is not provided. Further, in the non-processing space SPb, the configuration for actively exhausting an atmosphere in the non-processing space SPb to the outside of the casing CA is not provided. In particular, as shown in FIG. 15, the bottom plate 5w of the present example has closing portions cp that close the non-processing space SPb from below the casing CA. Thus, part of air guided from above the casing CA to the non-processing space SPb is not exhausted to the outside of the non-processing space SPb due to the closing portions cp. As a result, the pressure in the non-processing space SPb is sufficiently higher than the pressure in each processing space SPa.

Since the pressure in the non-processing space SPb surrounding the processing spaces SPa is higher than the pressure in each processing space SPa, that is, the pressure in the processing space SPa is lower than the pressure in the non-processing space SPb, leakage of an atmosphere in the processing space SPa out of the casing CA through the non-processing space SPb is suppressed.

Here, in a case in which the internal space SP of the casing CA is partitioned into the processing spaces SPa and the non-processing space SPb, each cover member 330 desirably closes the nozzle opening 110 such that a flow of gas through the nozzle opening 110 is completely blocked. However, in a case in which the cover member 330 is repeatedly in contact and not in contact with the partition plate 100 each time the development processing for the substrate W is performed, particles may be generated. Therefore, it is desirable that the cover member 330 does not come into contact with the partition plate 100.

As such, in the present embodiment, the cover member 330 covers the nozzle opening 110 without coming into contact with the partition plate 100 during the development processing for the substrate W. The cover member 330 and the partition plate 100 are formed as described below so as to reduce a flow of gas in the nozzle opening 110 when the nozzle opening 110 is covered by the cover member 330.

Figure 16:
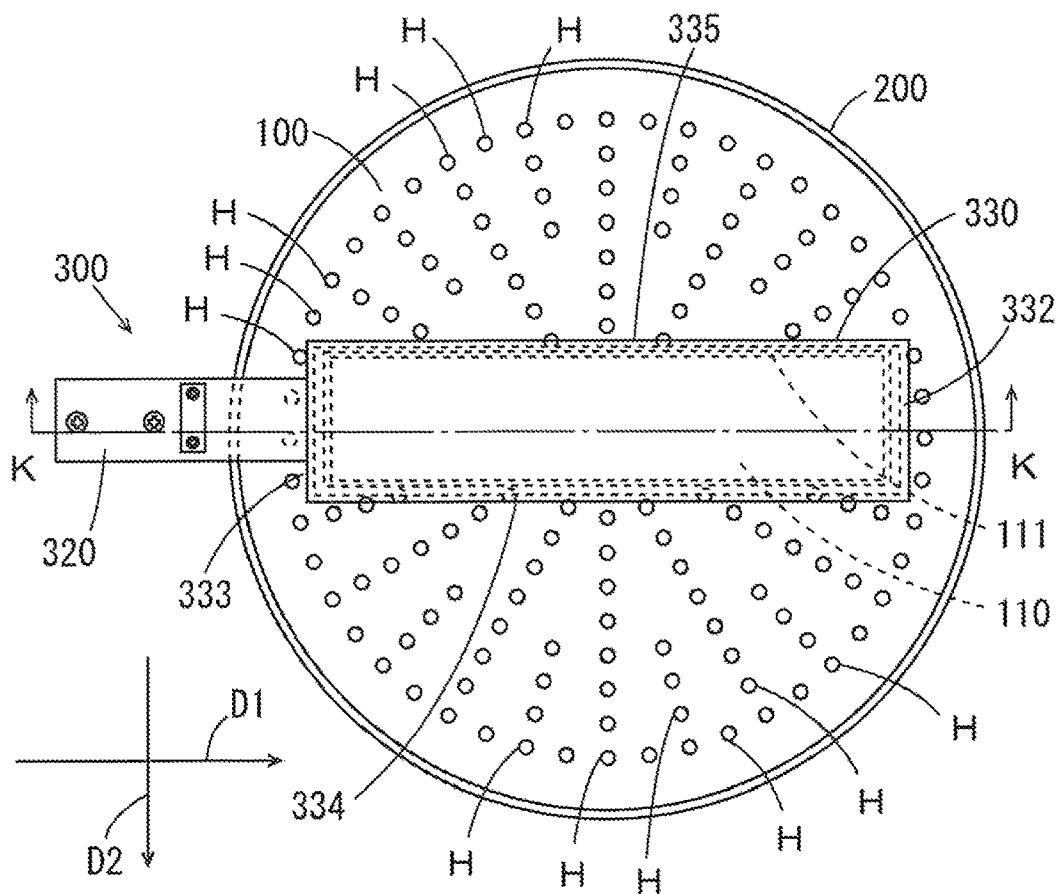
FIG. 16 is a plan view showing one example of a nozzle opening of the partition plate being covered by a cover member.
Figure 17:
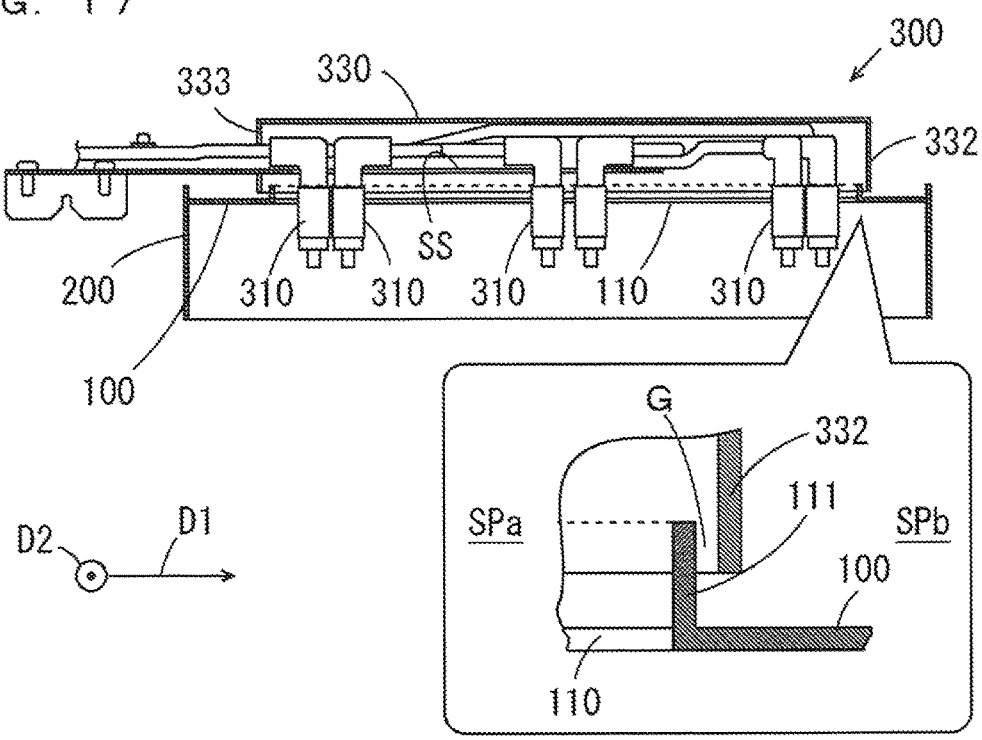
FIG. 17 is a longitudinal cross sectional view of the partition plate, the cylindrical member and the nozzle arm unit taken along the line K-K of FIG. 16.

FIG. 16 is a plan view showing one example of the nozzle opening 110 of the partition plate 100 being covered by the cover member 330, and FIG. 17 is a longitudinal cross-sectional view of the partition plate 100, the cylindrical member 200 and the nozzle arm unit 300 taken along the line K-K of FIG. 16. In FIG. 16, the plurality of pipes 311, 312 are not shown.

As shown in FIG. 16, in a case in which covering the nozzle opening 110, the cover member 330 is held such that the entire upper surface portion 331 (FIG. 5) covers the entire nozzle opening 110 in a plan view. The plurality of end-surface portions and side-surface portions (332 to 335) of the cover member 330 are formed so as to surround the entire wall portion 111 of the partition plate 100 with a minute gap therebetween in a plan view when the cover member 330 covers the nozzle opening 110.

As shown in FIG. 17, the cover member 330 is held such that parts of the plurality of end-surface portions and side-surface portions (332 to 335) overlap with the wall portion 111 of the partition plate 100 in a side view and does not come into contact with the partition plate 100. In FIG. 17, an enlarged cross-sectional view of the lower end portion of the one end-surface portion 332 of the cover member 330 and its vicinal portions is shown in the balloon.

As shown in the balloon of FIG. 17, in a case in which the nozzle opening 110 is covered by the cover member 330, a gap space G is formed between the processing space SPa and the non-processing space SPb. The gap space G is the space interposed between the wall portion 111 of the partition plate 100 and the plurality of end-surface portions and side-surface portions (332 to 335) of the cover member 330. Thus, it is possible to reduce a flow of gas in the nozzle opening 110 as compared to a case in which the wall portion 111 is not formed in the partition plate 100 or the cover member 330 is constituted by only the upper surface portion 331. The distance (distance of the gap space G) between the wall portion 111 of the partition plate 100 and the plurality of end-surface portions and side-surface portions (332 to 335) of the cover member 330 in a plan view is preferably set to about 2 mm to 5 mm, for example.

In the development device 1 according to the present embodiment, when the cup 40 is in the second state, the upper end of the cup 40 and the inner peripheral surface in the vicinity of the lower end of the cylindrical member 200 are close to each other. In this case, a gap space is formed between the cylindrical member 200 and an upper portion of the cup 40. Thus, as compared to a case in which the cylindrical member 200 is not present, a flow of an atmosphere in the processing space SPa from between the cup 40 and the partition plate 100 into the non-processing space SPb is reduced. The distance between the inner peripheral surface of the cylindrical member 200 and the outer peripheral surface of the cup 40 (the distance of the gap space between the cylindrical member 200 and the upper portion of the cup 40) in a plan view is preferably set to about 2 mm to 5 mm, for example.

<3> Configuration of Controller of Development Device 1

Figure 18:
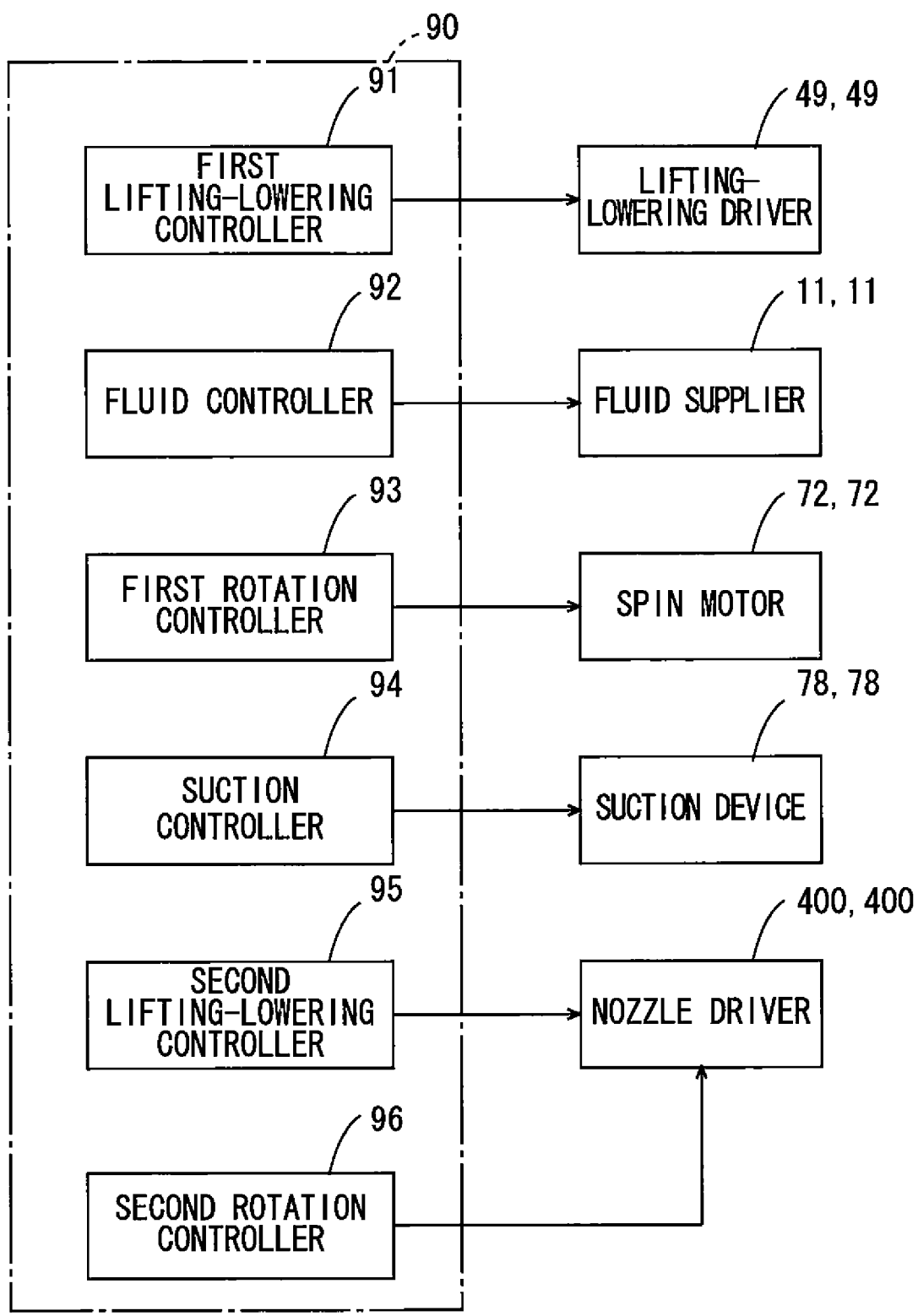
FIG. 18 is a block diagram showing the configuration of a controller of the development device 1 of FIG. 1.

FIG. 18 is a block diagram showing the configuration of the controller 90 of the development device 1 of FIG. 1. As shown in FIG. 18, the controller 90 includes a first lifting-lowering controller 91, a fluid controller 92, a first rotation controller 93, a suction controller 94, a second lifting-lowering controller 95 and a second rotation controller 96. The function of each element of the controller 90 of FIG. 18 is implemented by execution of a predetermined program stored in a memory by a CPU, for example.

The first lifting-lowering controller 91 controls the operation of the lifting-lowering driver 49 of the liquid processing units LPA, LPB. Thus, the cup 40 of each of the liquid processing units LPA, LPB changes to the first state or the second state. The fluid controller 92 controls the operation of the two fluid suppliers 11 of FIG. 1. Thus, in each of the liquid processing units LPA, LPB, a fluid mixture of a development liquid and gas is injected from part of the plurality of nozzles 310, and a fluid mixture of a rinse liquid and gas is injected from the rest of the nozzles 310.

The first rotation controller 93 controls the operation of the spin motors 72 of the liquid processing units LPA, LPB of FIG. 1. Further, the suction controller 94 controls the operation of the suction devices 78 of the liquid processing units LPA, LPB of FIG. 1. Thus, in each substrate holding device 70, the substrate W is held by suction and rotated in a horizontal attitude.

The second lifting-lowering controller 95 and the second rotation controller 96 control the operation of the nozzle drivers 400 of the liquid processing units LPA, LPB of FIG. 1. Specifically, the second lifting-lowering controller 95 controls the operation of an actuator of each nozzle driver 400. The second rotation controller 96 controls the operation of a motor having the rotation shaft 401 of each nozzle driver 400.

<4> Basic Operation of Development Device 1

Figure 19:
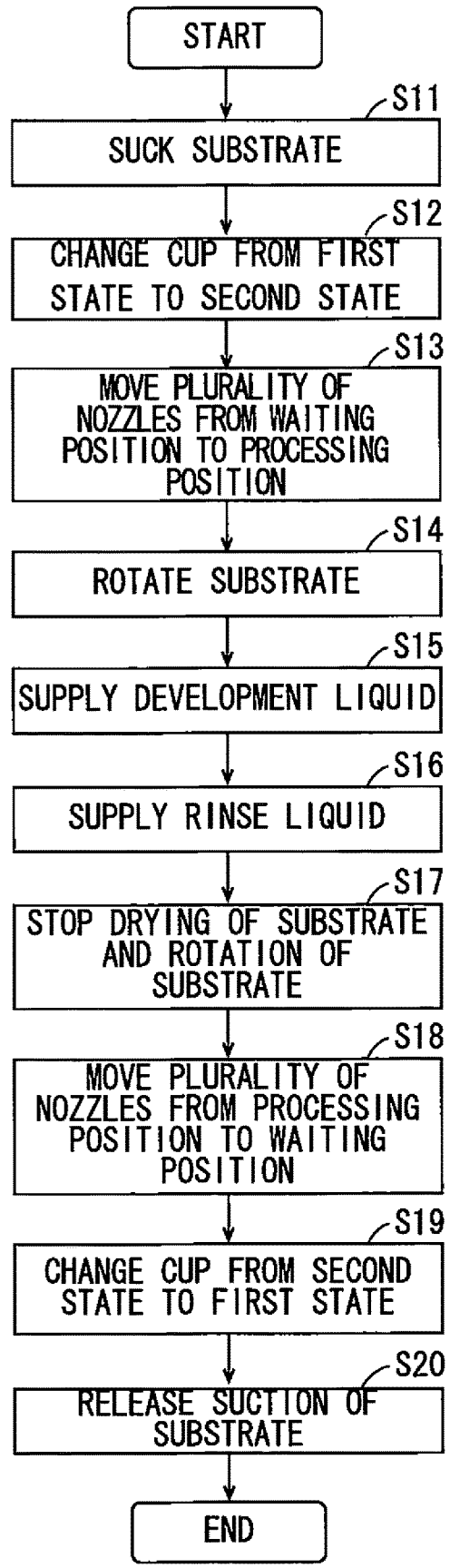
FIG. 19 is a flowchart showing the basic operation during the development processing for the substrate by the development device.

The basic operation of the development device 1 will be described. FIG. 19 is a flowchart showing the basic operation during the development processing for the substrate W1 performed by the development device 1. In an initial state, air the temperature, humidity and the like of which are adjusted is supplied from the gas supplier 10 to the development device 1. Further, an atmosphere in the casing CA is guided to the exhaust device (not shown) from the exhaust pipes 61 of the liquid processing units LPA, LPB. A downward flow of clean air is formed in the casing CA. Further, in the initial state, the cup 40 is held in the first state. Further, the plurality of nozzles 310 are held at the waiting position P1.

Before the development processing for the substrate W is started, the substrate W to be processed is first carried into the liquid processing unit LPA, LPB. Further, as shown in FIG. 13, the substrate W is placed on the suction holder 71 of the substrate holding device 70. When the development processing for the substrate W is started, the suction controller 94 of FIG. 18 controls the suction device 78 of the liquid processing unit LPA, LPB such that the substrate W is sucked by the suction holder 71 of the substrate holding device 70 (step S11).

Next, the first lifting-lowering controller 91 of FIG. 18 controls the lifting-lowering driver 49 of the liquid processing unit LPA, LPB such that cup 40 changes from the first state to the second state (step S12).

Next, the second lifting-lowering controller 95 and the second rotation controller 96 of FIG. 18 control the nozzle driver 400 of the liquid processing unit LPA, LPB such that the plurality of nozzles 310 move from the waiting position P1 to the processing position P2 (step S13).

Next, the first rotation controller 93 of FIG. 18 controls the spin motor 72 of the liquid processing unit LPA, LPB such that the substrate W rotates about the rotation shaft 73 (step S14).

Next, the fluid controller 92 of FIG. 18 controls the fluid supplier 11 of the liquid processing unit LPA, LPB such that a development liquid is supplied to the substrate W from part of the plurality of nozzles 310 for a predetermined period of time (step S15). Further, the fluid controller 92 of FIG. 18 controls the fluid supplier 11 of the liquid processing unit LPA, LPB such that a rinse liquid is supplied to the substrate W from the rest of the plurality of nozzles 310 for a predetermined period of time (step S16).

Next, the first rotation controller 93 of FIG. 18 dries the substrate W by continuing to rotate the substrate W until a constant period of time elapses from the time when supply of the rinse liquid is stopped. Further, the first rotation controller 93 of FIG. 18 controls the spin motor 72 of the liquid processing unit LPA, LPB such that the rotation of the substrate W is stopped after the constant period of time elapses from the time when supply of the rinse liquid is stopped (step S17).

Next, the second lifting-lowering controller 95 and the second rotation controller 96 of FIG. 18 control the nozzle driver 400 of the liquid processing unit LPA, LPB such that the plurality of nozzles 310 move from the processing position P2 to the waiting position P1 (step S18).

Next, the first lifting-lowering controller 91 of FIG. 18 controls the lifting-lowering driver 49 of the liquid processing unit LPA, LPB such that cup 40 changes from the second state to the first state (step S19).

Finally, the suction controller 94 of FIG. 18 controls the suction device 78 of the liquid processing unit LPA, LPB such that suction of the substrate W by the suction holder 71 of the substrate holding device 70 is released (step S20). Thus, the development processing for the substrate W ends. The substrate W on which the development processing has been performed is carried out from the liquid processing unit LPA, LPB.

<5> Effects (1) In the above-mentioned development device 1, portions of the plurality of nozzles 310 and the plurality of pipes 311, 312 are contained in the cover member 330 while being supported by the support 320. Thus, the portions of the plurality of nozzles 310 and the plurality of pipes 311, 312 can be handled together with the cover member 330. Therefore, handleability of the plurality of nozzles 310 and the plurality of pipes 311, 312 in the developing device 1 is improved.

Further, in a case in which the plurality of nozzles 310 move between the waiting position P1 and the processing position P2, the support 320 is moved or rotated by the nozzle driver 400. At this time, because parts of the plurality of pipes 311, 312 are contained in the cover member 330, the range in which the portions of the plurality of pipes 311, 312 can be deformed is limited to the inside of the cover member 300. Therefore, large deformation of the portions of the plurality of pipes 311, 312 during movement of the plurality of nozzles 310 is suppressed. This reduces generation of particles and a reduction in lifetime of the plurality of pipes 311, 312 caused by movement of the plurality of respective pipes 311, 312 with a high degree of freedom.

(2) In the nozzle arm unit 300, the support 320 is formed to extend linearly. Further, the plurality of nozzles 310 are attached to the support 320 so as to be aligned in the direction in which the support 320 extends. Further, the cover member 330 is formed so as to extend along the support 320. Further, in the nozzle arm unit 300, the plurality of pipes 311, 312 extending from the plurality of nozzles 310 are bound in the vicinity of the other end portion 322 of the support 320 to be fixed to the pipe fixing portion 324.

In this case, portions of the plurality of pipes 311, 312 can be contained in the cover member 330 while extending along the support 320. This suppresses formation of large play in each of the plurality of pipes 311, 312 in the cover member 330. Further, during movement and rotation of the nozzle arm unit 300, large deformation of the portions of the plurality of pipes 311, 312 located between the plurality of nozzles 310 and the pipe fixing portion 324 of the support 320 is suppressed. Further, the cover member 330 can be made compact.

(3) An organic solvent included in a development liquid and a rinse liquid used in the development processing for the substrate W may have a characteristic strong odor. In the above-mentioned development device 1, during the development processing for the substrate W, the internal space SP of the casing CA is partitioned into the processing spaces SPa and the non-processing space SPb by the partition plate 100, the cylindrical member 200, the cover member 330, the cup 40 and the container 50 during the development processing for the substrate W. Part of a downward airflow is guided to each processing space SPa through the plurality of through holes H of the partition plate 100. In this case, an amount of gas supplied to the processing space SPa can be made smaller than an amount of gas supplied to the non-processing space SPb. Thus, the pressure in the processing space SPa can be made lower than the pressure in the non-processing space SPb.

In a case in which the pressure in the processing space SPa is lower than the pressure in the non-processing space SPb, an atmosphere in the processing space SPa is unlikely to enter the non-processing space SPb. Therefore, in a case in which being generated in the processing space SPa, an odor caused by a processing liquid is unlikely to leak to the outside of the casing CA.

Further, in the above-mentioned configuration, the nozzle opening 10 is formed in the partition plate 100. With this configuration, the plurality of nozzles 310 do not interfere with the partition plate 100 with the plurality of nozzles 310 located at the processing position P2. Further, with the plurality of nozzles 310 located at the processing position P2, the nozzle opening 110 formed in the partition plate 100 is covered by the cover member 330. Thus, when a development liquid or a rinse liquid is supplied from the plurality of nozzles 310 to the substrate W, leakage of an atmosphere in the processing space SPa from the nozzle opening 110 to the non-processing space SPb is reduced.

As a result, degradation of comfort of a working environment around the development device 1 can be suppressed.

(4) In the above-mentioned development device 1, in each of the liquid processing units LPA, LPB, an atmosphere in the container 50 is exhausted to the outside of the casing CA through the exhaust pipe 61. On the other hand, the closing portions cp for closing the non-processing space SPb from below the casing CA are provided at the bottom plate 5w. Therefore, the pressure in the processing space SPa can be easily made lower than the pressure in the non-processing space SPb during the development processing for the substrate W.

<6> Other Embodiments (1) In the development device 1 according to the above-mentioned embodiment, an exhauster that exhausts an atmosphere in the non-processing space SPb to the outside of the casing CA may be provided at the bottom plate 5w. In this case, during the development processing for the substrate W, it is desirable to control an amount of gas to be exhausted from each processing space SPa and an amount of gas to be exhausted from the non-processing space SPb such that the pressure in the processing space SPa is kept lower than the pressure in the non-processing space SPb.

(2) In the development device 1 according to the above-mentioned embodiment, as long as the pressure in each processing space SPa can kept lower than the pressure in the non-processing space SPb during the development processing for the substrate W, the partition plate 100 does not have to be provided.

(3) While being applied to the development device by way of example in the above-mentioned embodiment, the present invention is not limited to this. The present invention may be applied to a substrate processing apparatus that processes a substrate W by injecting or discharging fluid from a plurality of nozzles to the substrate W.

(4) While two substrates W are subjected to the development processing at the same time by the liquid processing units LPA, LPB contained in the casing CA in the development device 1 according to the above-mentioned embodiment, the present invention is not limited to this. The development processing for the substrate W in the liquid processing unit LPA and the development processing for the substrate W in the liquid processing unit LPB may be performed at the same time or at different points in time.

For example, suppose that the development processing is performed on the substrate W in one liquid processing unit LPA (LPB) and the development processing is not performed on the substrate W in the other liquid processing unit LPB (LPA). In this case, in the one liquid processing unit LPA (LPB), the cup 40 is kept in the second state, and the plurality of nozzles 310 are held at the processing position P2. Further, in the other liquid processing unit LPB (LPA), the cup 40 is kept in the first state, and the plurality of nozzles 310 are held at the waiting position P1. Thus, in the casing CA, the one processing space SPa is formed in the one liquid processing unit LPA (LPB), and the internal space of the other liquid processing unit LPB (LPA) is the non-processing space SPb.

(5) In the partition plate 100 according to the above-mentioned embodiment, the shape of the nozzle opening 110 is not limited to the above-mentioned oblong. The nozzle opening 110 may be in another shape such as an oval, a circle, a square, a triangle, a tetragon, a pentagon or a hexagon. In this case, the cover member 330 has the shape corresponding to the shape of the nozzle opening 110 of the partition plate 100.

(6) While the cover member 330 covers the nozzle opening 110 so as not to come into contact with the partition plate 100 with the plurality of nozzles 310 located at the processing position P2 in the development device 1 according to the above-mentioned embodiment, the present invention is not limited to this. For example, in a case in which generation of particles due to contact and non-contact between the cover member 330 and the partition plate 100 is suppressed by devising of a different configuration or the like, the cover member 330 may close the nozzle opening 110 while being in contact with the partition plate 100. Alternatively, in a case in which generation of particles due to contact and non-contact between the cover member 330 and the partition plate 100 is suppressed to some extent, the cover member 330 may close the nozzle opening 110 while being in contact with the partition plate 100.

(7) While each of the cup 40 and the cylindrical member 200 according to the above-mentioned embodiment has an annular horizontal cross section, the present invention is not limited to this. Each of the cup 40 and the cylindrical member 200 may be configured to surround the substrate holding device 70 in a plan view and may have a polygonal horizontal cross section.

(8) While the two liquid processing units LPA, LPB are provided in the one casing CA in the development device 1 according to the above-mentioned embodiment, the present invention is not limited to this. In the casing CA, only one liquid processing unit may be provided, or three or more than three liquid processing units may be provided.

(9) While each of the plurality of nozzles 310 is constituted by a two-fluid nozzle in the development device 1 according to the above-mentioned embodiment, the present invention is not limited to this. Each of the plurality of nozzles 310 may be a nozzle of a type other than a two-fluid nozzle.

(10) While the cutout 333N is formed in the other end-surface portion 333 in order to draw out part of the support 320 from the cover member 330 in the cover member 330 according to the above-mentioned embodiment, the present invention is not limited to this. As long as the pressure in the processing space SPa can be made lower than the pressure in the non-processing space SPb during the development processing for the substrate W, the cover member 330 does not have to have the other end-surface portion 333.

<7> Correspondences Between Constituent Elements in Claims and Parts in Preferred Embodiments In the following paragraphs, non-limiting examples of correspondences between various elements recited in the claims below and those described above with respect to various preferred embodiments of the present disclosure are explained.

In the above-mentioned embodiment, the substrate holding device 70 is an example of a substrate holder, the plurality of nozzles 310 are an example of a plurality of nozzles, the plurality of pipes 311 are an example of a plurality of liquid pipes, portions of a plurality of pipes 311 located in the nozzle arm unit 300 are an example of first portions of a plurality of liquid pipes, the support 320 is an example of a support, the cover member 330 is an example of a containing member, a processing position P2 is an example of a processing position, the waiting position P1 is an example of a waiting position, the nozzle driver 400 is an example of a nozzle driver, and the development device 1 is an example of a substrate processing apparatus.

Further, the plurality of nozzle fixing portions 323 of the support 320 are an example of a plurality of nozzle fixing portions, the pipe fixing portion 324 of the support 320 is an example of a first pipe fixing portion, the portions of the plurality of pipes 311 located outside of the nozzle arm unit 300 is an example of second portions of a plurality of liquid pipes, the cylindrical binding member 391 is an example of a cylindrical binder, and the fixing portion 392 is an example of a second pipe fixing portion.

The casing CA is an example of a chamber, the processing space SPa is an example of a processing space, the non-processing space SPb is an example of a non-processing space, the partition plate 100, the cylindrical member 200 and the cup 40 are examples of a partition, the cup 40 is an example of a processing cup, the nozzle opening 110 is an example of a nozzle opening, the partition plate 100 is an example of a partition plate, the plurality of pipes 312 are an example of one or a plurality of gas pipes, and the portions of the plurality of pipes 312 located in the nozzle arm unit 300 are an example of a third portion of one or a plurality of gas pipes.

As each of constituent elements recited in the claims, various other elements having configurations or functions described in the claims can be also used.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

I claim:

1. A substrate processing apparatus comprising:
a substrate holder that holds a substrate;
a plurality of nozzles that respectively supply a processing liquid to a substrate held by the substrate holder;
a plurality of liquid pipes that are flexible, have first portions respectively connected to the plurality of nozzles and supply a processing liquid to the plurality of nozzles;
a support that supports the plurality of nozzles and supports the first portions of the plurality of liquid pipes;
a containing member that is attached to the support and contains the plurality of nozzles and the first portions of the plurality of liquid pipes while allowing supply of a processing liquid to the substrate from the plurality of nozzles; and a nozzle driver that moves each of the plurality of nozzles between a processing position above the substrate held by the substrate holder and a waiting position outwardly of the substrate held by the substrate holder by moving or rotating the support, wherein the support includes a plurality of nozzle fixing portions to which the plurality of nozzles are respectively fixed, and a first pipe fixing portion to which the first portions of the plurality of liquid pipes are fixed while being bound.

2. The substrate processing apparatus according to claim 1, wherein the support is formed to extend linearly, the plurality of nozzles are attached to the support to be aligned in a direction in which the support extends, and the containing member is formed to extend along the support.

3. The substrate processing apparatus according to claim 1, wherein the plurality of liquid pipes respectively further have second portions respectively extending from the first portions, and the substrate processing apparatus further includes a cylinder binder that is formed to bind the second portions of the plurality of liquid pipes and cover the second portions of the plurality of bound liquid pipes, and a second pipe fixing portion to which the second portions of the plurality of liquid pipes bound by the cylindrical binder are fixed.

4. A substrate processing apparatus, comprising:

a substrate holder that holds a substrate;

a plurality of nozzles that respectively supply a processing liquid to a substrate held by the substrate holder;

a plurality of liquid pipes that are flexible, have first portions respectively connected to the plurality of nozzles and supply a processing liquid to the plurality of nozzles;

a support that supports the plurality of nozzles and supports the first portions of the plurality of liquid pipes;

a containing member that is attached to the support and contains the plurality of nozzles and the first portions of the plurality of liquid pipes while allowing supply of a processing liquid to the substrate from the plurality of nozzles;

a nozzle driver that moves each of the plurality of nozzles between a processing position above the substrate held by the substrate holder and a waiting position outwardly of the substrate held by the substrate holder by moving or rotating the support;

a chamber that has an inner space and contains the substrate holder, the plurality of nozzles, the plurality of liquid pipes, the support, the containing member and the nozzle driver in the inner space; and a partition that partitions the inner space of the chamber into a processing space including the substrate held by the substrate holder and a non-processing space surrounding at least part of the processing space with the substrate held by the substrate holder, wherein the partition includes a processing cup that is provided to surround a substrate held by the substrate in a plan view and overlap with the substrate held by the substrate holder in a side view, and forms the processing space, and a partition plate that is provided at a position above the processing cup and has a nozzle opening formed to overlap with the processing position in a plan view, and the containing member is configured to cover the nozzle opening while allowing supply of a processing liquid from the nozzle to the substrate with the substrate held by the substrate holder and the plurality of nozzles located at the processing position.

5. The substrate processing apparatus according to claim 1, wherein the plurality of nozzles include one or a plurality of two-fluid nozzles that inject a fluid mixture including gas and droplets of the processing liquid to the substrate held by the substrate holder.

6. The substrate processing apparatus according to claim 5, further comprising one or a plurality of gas pipes that supply gas to the one or plurality of two-fluid nozzles, wherein the one or plurality of gas pipes have third portions respectively connected to the one or plurality of two-fluid nozzles, and the third portions of the one or plurality of gas pipes are supported by the support and contained in the containing member.

7. The substrate processing apparatus according to claim 1, wherein a processing liquid supplied from at least part of the plurality of nozzles to the substrate includes an organic solvent.

* * * * *